US012635546B2

(12) United States Patent
Chang et al.

(10) Patent No.: US 12,635,546 B2
(45) Date of Patent: May 19, 2026

(54) ELECTRONIC DEVICE

(71) Applicant: Advanced Semiconductor Engineering, Inc., Kaohsiung (TW)

(72) Inventors: Chun-Kai Chang, Kaohsiung (TW); Hao-Chih Hsieh, Kaohsiung (TW); Chao Wei Liu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 235 days.

(21) Appl. No.: 18/628,565

(22) Filed: Apr. 5, 2024

(65) Prior Publication Data

US 2025/0316604 A1 Oct. 9, 2025

(51) Int. Cl.
H01L 23/538 (2006.01)

(52) U.S. Cl.
CPC ................................ H01L 23/5386 (2013.01)

(58) Field of Classification Search
CPC ...................... H01L 23/5386; H01L 23/49816
See application file for complete search history.

(56) References Cited

U.S. PATENT DOCUMENTS

| | | | |
|---|---|---|---|
| 7,315,085 B2 | 1/2008 | Liu | |
| 11,443,997 B2 | 9/2022 | Cho et al. | |
| 2019/0080993 A1* | 3/2019 | Chen | H01L 23/295 |
| 2020/0211956 A1* | 7/2020 | Wu | H01L 23/3171 |
| 2021/0298176 A1* | 9/2021 | Chen | H01L 21/486 |
| 2023/0009219 A1* | 1/2023 | Tien | H01L 25/162 |
| 2023/0102457 A1* | 3/2023 | Chen | H01L 23/5384 |
| | | | 257/737 |

* cited by examiner

*Primary Examiner* — Sherman Ng
(74) *Attorney, Agent, or Firm* — Foley & Lardner LLP

(57) ABSTRACT

An electronic device is provided. The electronic device includes a carrier and a protection layer. The carrier has a predetermined region and includes a pad disposed in the predetermined region. The protection layer is disposed over the carrier and defines the predetermined region. The protection layer is configured to block an encapsulation layer from covering the pad.

15 Claims, 41 Drawing Sheets

ELECTRONIC DEVICE

BACKGROUND

1. Field of the Disclosure

The present disclosure relates to an electronic device and a method of manufacturing the same.

2. Description of the Related Art

In current 3D stacking technology, deviations in the thickness of stacked substrates result in different heights for each package unit. In the compound molding process, the mold (e.g., with release film) cannot uniformly apply a downward force onto package units with different heights. The compound would climb onto the pads of the package units with lower heights, deteriorating the connection between the pads and solder bumps.

SUMMARY

In some embodiments, an electronic device includes a carrier and a protection layer. The carrier has a predetermined region and includes a pad disposed in the predetermined region. The protection layer is disposed over the carrier and defines the predetermined region. The protection layer is configured to block an encapsulation layer from covering the pad.

In some embodiments, an electronic device includes a carrier and an encapsulation layer. The carrier includes a plurality of pads. The encapsulation layer covers a periphery region of the carrier. In a top view, a portion of the encapsulation layer is disposed at a surrounding area of at least one pad of the pads.

In some embodiments, an electronic device includes a protection layer and a connection element. The protection layer includes an opening and a blocking structure configured to block an encapsulation layer from entering the opening. The connection element is disposed in the opening and configured to connect an external device other than the electronic device.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

FIG. 6A, 6B, 6C, 6D, 6D-1 or 6E illustrates one or more stages of an example of a method for manufacturing an electronic device according to some embodiments of the present disclosure.

FIG. 6B-1, 6B-2, 6B-3, or 6B-4 illustrates one or more stages of manufacturing a structure in a box B2 of FIG. 6B according to some embodiments of the present disclosure.

DETAILED DESCRIPTION

Figure 1:
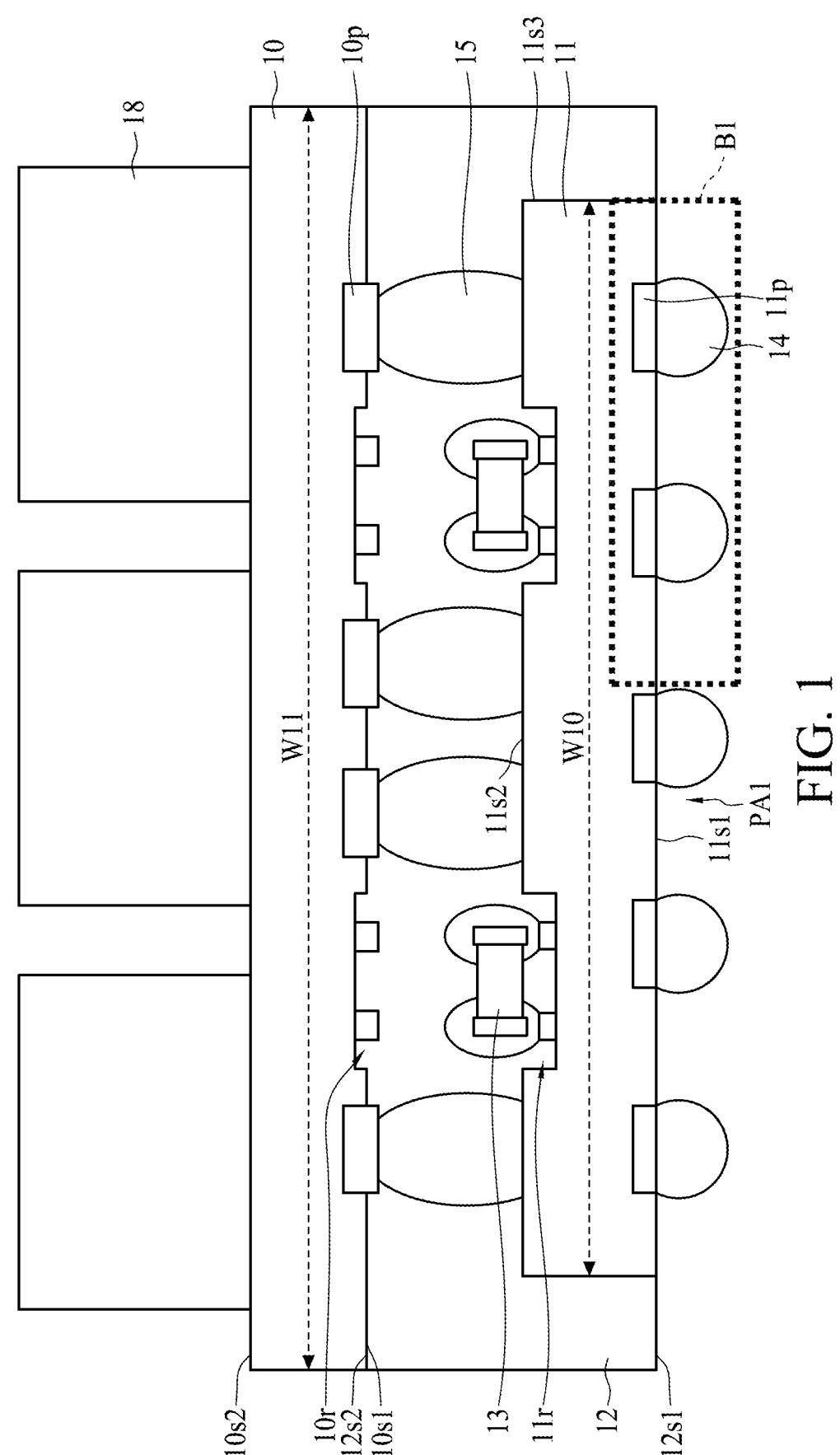
FIG. 1 is a cross-sectional view of an electronic device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a cross-section of an electronic device 1 according to some embodiments of the present disclosure. The electronic device 1 may include a carrier 10, a carrier 11, an encapsulation layer 12, one or more electronic components 13, a plurality of connection elements 14, a plurality of connection elements 15, and one or more electronic components 18.

The carrier (or a circuit structure, a substrate) 10 may be disposed over the carrier 11. The carrier 10 may have a first surface 10s1 and a second surface 10s2 opposite to the first surface 10s1. The first surface 10s1 may face the carrier 11 and the encapsulation layer 12. The second surface 10s2 may face away from the carrier 11 and the encapsulation layer 12. The carrier 10 may be or include, for example, one or more of a printed circuit board, such as a paper-based copper foil laminate, a composite copper foil laminate, a polymer-impregnated glass-fiber-based copper foil laminate, and so on. The carrier 10 may include a dielectric layer and an interconnection structure, such as a redistribution layer (RDL) and/or a grounding element. The interconnection layer may be covered or encapsulated by the dielectric layer. The carrier 10 may include a plurality of pads 10p at the first surface 10s1.

The one or more electronic components 18 may be mounted to the second surface 10s2 of the carrier 10. The one or more electronic components 18 may be electrically connected to the carrier 10 through the pads 10p. The one or more electronic components 18 may be electrically connected to the carrier 11 through the carrier 10. The electronic component 18 may be supported by the carrier 10.

In some embodiments, the electronic component 18 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the electronic component 18 may include one or more processing elements and one or more memory elements electrically connected to the processing elements. The processing element(s) and the memory element(s) may be divided from or originate in a monolithic processing unit (e.g., a CPU, a MPU, a GPU, a MCU, an ASIC, or the like). In some embodiments, the processing element may be a CPU chiplet, a MCU chiplet, a GPU chiplet, an ASIC chiplet, or the like. The memory element may be a cache memory.

The carrier (or a circuit structure, a substrate) 11 may have a first surface 11s1 and a second surface 11s2 opposite to the first surface 11s1. The first surface 11s1 may face away from the carrier 11 and the encapsulation layer 12. The second surface 10s2 may face the carrier 10 and the encapsulation layer 12. The carrier 11 may be or include, for example, one or more of a printed circuit board, such as a paper-based copper foil laminate, a composite copper foil laminate, a polymer-impregnated glass-fiber-based copper foil laminate, and so on. The carrier 11 may include a dielectric layer and an interconnection structure, such as a redistribution layer (RDL) and/or a grounding element. The interconnection layer may be covered or encapsulated by the dielectric layer.

The carrier 11 may have a lateral surface 11s3 extending between the first surface 11s1 and the second surface 11s2. The lateral surface 11s3 may be covered by the encapsulation layer 12. The second surface 11s2 may be covered by the encapsulation layer 12 and the first surface 11s1 may be exposed by the encapsulation layer 12.

The carrier 11 may have a width W10 and the carrier 10 may have a width W11. The width W10 is smaller than the width W10. The carrier 11 may be referred to as a sub-carrier and the carrier 10 may be referred to as a mother board. The carrier 11 may be mounted to the carrier 10, followed by the application of the encapsulation layer 12. In some embodiments, a density of a circuit line (including, for example, a trace or a pad) of the carrier 11 is greater than a density of a circuit line of the carrier 10.

The connection elements 15 may be disposed between the carrier 10 and the carrier 11. The connection elements 15 may be covered or encapsulated by the encapsulation layer 12. The connection elements 15 may be electrically connected to the carrier 10 and the carrier 11. The carrier 11 may be electrically connected to the carrier 10 through the connection elements 15. The connection elements 15 may be higher than the one or more electronic components 13 in a vertical direction (or a direction perpendicular to the first surface 11s1 or the second surface 11s2 of the carrier 11). The connection elements 15 are mounted to the carrier 10 and the carrier 11. The connection elements 15 may include solder balls, controlled collapse chip connection (C4) bumps, a ball grid array (BGA), or a land grid array (LGA).

The one or more electronic components 13 may be mounted to the carrier 11. The one or more electronic components 13 may be electrically connected to the carrier 11 through a plurality of pads at the second surface 11s2 of the carrier 11. The one or more electronic components 13 may be supported by the carrier 11. The one or more electronic components 13 may be disposed over the carrier 11. The one or more electronic components 13 may be spaced apart from the carrier 10. The one or more electronic components 13 may be covered or encapsulated by the encapsulation layer 12.

The electronic component 13 may be electrically connected to the carrier 11 through surface mount technology (SMT). The electronic component 13 may be or include a surface mount device (SMD). The electronic component 13 may be or include a passive device, e.g., a capacitor, a resistor, an inductor, a diode, or the like. The electronic component 13 may be or include an active device, e.g., a transistor.

The encapsulation layer 12 may have a first surface 12s1 and a second surface 12s2 opposite to the first surface 12s1. The first surface 12s1 of the encapsulation layer 12 may be substantially coplanar to the first surface 11s1 of the carrier 11. In some embodiments, the first surface 12s1 of the encapsulation layer 12 may be further away from the second surface 11s2 of the carrier 11 than the first surface 11s1 of the carrier 11. The second surface 12s2 of the encapsulation layer 12 may be in contact with the first surface 10s1 of the carrier 10. The encapsulation layer 12 may include an epoxy resin including fillers, a molding compound (e.g., an epoxy molding compound or other molding compound), polyimide, a phenolic compound or material, a material including silicone dispersed therein, or a combination thereof. The encapsulation layer 12 may be electrically insulative.

The carrier 11 may have a predetermined region PA1. The predetermined region PA1 may be configured to connect an external device (not shown) other than the electronic device 1. The carrier 11 may include a plurality of pads (or conductive pads) 11$p$ at the first surface 11$s$1. The plurality of pads 11$p$ may be disposed in the predetermined region PA1. The predetermined region PA1 may include the first surface 11$s$1. The connection elements 14 may be disposed on the pads 11$p$. The connection elements 14 may be disposed on the predetermined region PA1. The pads 11$p$ may be made of metal, such as copper, gold, silver, aluminum, titanium, tantalum, or the like. The connection elements 14 may be electrically connected to the pads 11$p$. The connection elements 14 may be configured to connect an external device (not shown) other than the electronic device 1. An external device (not shown) may be electrically connected to the carrier 11 through the connection elements 14. The connection elements 14 are mounted to the carrier 11. The connection elements 14 may include solder balls, controlled collapse chip connection (C4) bumps, a ball grid array (BGA), or a land grid array (LGA).

The encapsulation layer 12 may have a portion which may "climb" on the first surface 11$s$1 of the carrier 11, which will be later discussed in FIG. 1D, 1E, 1F, 1G, 1H, 1I, and FIG. 1J. The term "climb" may mean that the portion of the encapsulation layer 12 partially extends over the first surface 11$s$1 of the carrier 11; or that the portion of the encapsulation layer 12 is squeezed out of the body of the encapsulation layer 12. The portion of the encapsulation layer 12 may be referred to as a "climbing portion." In some cases, the climbing portion of the encapsulation layer 12 may fully or partially cover one or more of the pads 11$p$ prior to the formation of the connection elements 14. In some cases, this would hinder the connection between the pads 11$p$ and the connection elements 14 since the climbing portion and the connection elements 14 cannot form a bond therebetween. In some cases, the insulative climbing portion obscures the electrical connection between the pads 11$p$ and the connection elements 14. In some cases, even though the pads 11$p$ may partially connect the connection elements 14 while the climbing portion partially covers the pads 11$p$, the bonding between the pads 11$p$ and the connection elements 14 is weak, leading to de-bonding of the connection elements 14.

Figure 1A:
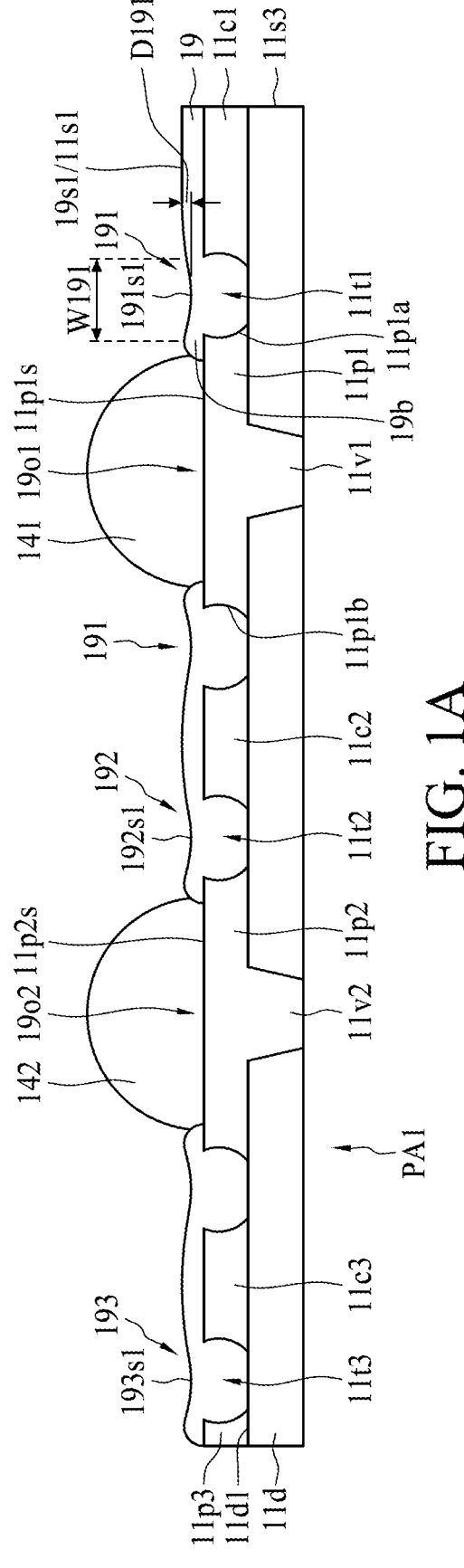
FIG. 1A is an enlarged cross-sectional view of a structure in a box B1 in FIG. 1.

The present disclosure provides the electronic device 1 including a blocking structure at the first surface 11$s$1 of the carrier 11 and around the pads 11$p$ to block the encapsulation layer (or the climbing portion) from covering the pads 11$p$. FIG. 1A is an enlarged cross-sectional view of a structure in a box B1 in FIG. 1. FIG. 1A is an upside-down view of the structure in box B1.

The pads 11$p$ may include a first pad (or a first conductive pad) 11$p$1, a second pad (or a second conductive pad) 11$p$2, and a third pad (or a third conductive pad) 11$p$3. The first pad 11$p$1 may be at the periphery region of the carrier 11, in other words, adjacent to the lateral surface 11$s$3 of the carrier 11. The second pad 11$p$2 and the third pad 11$p$3 may be further away from the periphery region of the carrier 11 than the first pad 11$p$1. The second pad 11$p$2 may be disposed between the first pad 11$p$1 and the third pad 11$p$3. The second pad 11$p$2 of the pads is disposed adjacent to the first pad 11$p$1.

The connection elements 14 may include a first connection element 141 and a second connection element 142. The first connection element 141 may be disposed over the first pad 11$p$1. The first connection element 141 may be connected to a surface (or a top surface) 11$p$1$s$ of the first pad 11$p$1. The second connection element 142 may be disposed over the second pad 11$p$2. The second connection element 142 may be connected to a surface 11$p$2$s$ of the second pad 11$p$2. A connection element (not shown) may be disposed over the third pad 11$p$3.

The carrier 11 may include a dielectric layer 11$d$, a first via 11$v$1, and a second via 11$v$2 disposed within the dielectric layer 11$d$. The dielectric layer 11$d$ may have a surface 11$d$1, and the pads 11$p$ (e.g., the first pad 11$p$1, the second pad 11$p$2, and/or the third pad 11$p$3) may be disposed over the surface 11$d$1 of the dielectric layer 11$d$. The material of the dielectric layer 11$d$ may include, for example, an organic material, a polyimide (PI), an Ajinomoto build-up film (ABF), and one or more molding compounds. The material of the dielectric layer 11$d$ may include, for example, an inorganic material silicon-oxide (SiO$_x$), or a silicon-nitride (SiN$_x$).

The first via 11$v$1 and the second via 11$v$2 may be made of metal, such as copper, gold, silver, aluminum, titanium, tantalum, or the like. The first via 11$v$1 may be connected to the first pad 11$p$1 and the second via 11$v$2 may be connected to the second pad 11$p$2. The first pad 11$p$1 may be applied with an electrical signal through the first via 11$v$1. The second pad 11$p$2 may be applied with an electrical signal through the second via 11$v$2. The electrical signals transmitted by the first pad 11$p$1 and the second pad 11$p$2 may represent data, a command, or a ground signal.

The electronic device 1 may further include a protection layer 19 disposed over the carrier 11. The protection layer 19 may be disposed over the dielectric layer 11$d$. The protection layer 19 may partially cover the pads 11$p$. In some embodiments, the material of the protection layer 19 may include insulation material, such as solder mask. The protection layer 19 may have a surface 19$s$1 which is referred to as the first surface 11$s$1 of the carrier 11.

The protection layer 19 may include a portion (or a blocking structure) 191 disposed over the first pad 11$p$1, a portion (or a blocking structure) 192 disposed over the second pad 11$p$2, and a portion (or a blocking structure) 193 disposed over the third pad 11$p$3. The protection layer 19 may be configured to "block" the encapsulation layer 12 from covering at least one of the pads 11$p$. Each of the blocking structure 191, the blocking structure 192, and the blocking structure 193 may be configured to "block" the encapsulation layer 12 from covering the pads 11$p$. The term "block" may indicate that the blocking structure 191, the blocking structure 192, or the blocking structure 193 may be configured to accommodate the encapsulation layer 12 (e.g., the climbing portion), such that the possibility of the encapsulation layer 12 arriving at the pads 11$p$ is lessened. The term "block" may indicate that blocking structure 191, the blocking structure 192, or the blocking structure 193 may barricade the encapsulation layer 12 (e.g., the climbing portion), such that the possibility of the encapsulation layer 12 arriving at the pads 11$p$ is lessened.

The protection layer 19 may include an opening 19$o$1 and an opening 19$o$2. The conductive pad 11$p$1 may be exposed by the opening 19$o$1. The conductive pad 11$p$2 may be exposed by the opening 19$o$2. A portion of the conductive pad 11$p$1 or the conductive pad 11$p$2 may be covered by the protection layer 19. The blocking structure 191 may be configured to block the encapsulation layer 12 from entering the opening 19o1. The blocking structure 192 may be configured to block the encapsulation layer 12 from entering the opening 19o2. The connection element 141 is disposed in the opening 19o1 without the obscuration of the encapsulation layer 12. The connection element 141 may be disposed in the opening 19o2 without the obscuration of the encapsulation layer 12.

The blocking structure 191 may be disposed at opposite two sides, i.e., a first side 11p1a and a second side 11p1b, of the first pad 11p1. The blocking structure 191 may be disposed between the first pad 11p1 and the second pad 11p2. The blocking structure 192 is disposed between the second pad 11p2 and the blocking structure 191 of the protection layer 19. The blocking structure 191 may be spaced apart from the first pad 11p1. The blocking structure 191 of the protection layer 19 may define a recess. In some embodiments, in the cross-sectional view, a width W191 of the recess is greater than a depth D191 of the recess of the blocking structure 191.

The blocking structure 191 may include a curved surface 191s1. A first elevation of the curved surface 191s1 (e.g., a bottom point thereof) may be higher than a second elevation of the surface 11p1s of the first pad 11p1 with respect to the second surface 11s2 of the carrier 11 facing away from the protection layer 19. The curved surface 191s1 may be higher than the surface of each of the pads 11p with respect to the second surface 11s2 of the carrier 11 facing away from the protection layer 19. An elevation of the surface 11p1s of the pad 11p1 may be lower than that of the recess of the blocking structure 191 with respect to the surface 11s2 of the carrier 11 facing away from the protection layer 19. The blocking structure 192 may be disposed at opposite two sides of the second pad 11p2. The blocking structure 192 may be disposed between the first pad 11p1 and the second pad 11p2. The blocking structure 192 may be disposed between the second pad 11p2 and the third pad 11p3. The blocking structure 193 is disposed between the third pad 11p3 and the blocking structure 192 of the protection layer 19. The blocking structure 192 may be spaced apart from the second pad 11p2. The blocking structure 192 of the protection layer 19 may include a recess. The blocking structure 192 may include a curved surface 192s1. A first elevation of the curved surface 192s1 (e.g., a bottom point thereof) may be higher than a second elevation of the surface 11p2s of the second pad 11p2 with respect to the second surface 11s2 of the carrier 11 facing away from the protection layer 19. The curved surface 191s2 may be higher than the surface of each of the pads 11p with respect to the second surface 11s2 of the carrier 11 facing away from the protection layer 19. An elevation of the surface 11p2s of the pad 11p2 may be lower than that of the recess of the blocking structure 192 with respect to the surface 11s2 of the carrier 11 facing away from the protection layer 19.

The blocking structure 193 may be disposed at opposite two sides of the third pad 11p3. The blocking structure 193 may be disposed between the second pad 11p2 and the third pad 11p3. The blocking structure 193 may be spaced apart from the third pad 11p3. The blocking structure 193 of the protection layer 19 may include a recess. The blocking structure 193 may include a curved surface 193s1. A first elevation of the curved surface 193s1 (e.g., a bottom point thereof) may be higher than a second elevation of the surface 11p3s of the third pad 11p3 with respect to the second surface 11s2 of the carrier 11 facing away from the protection layer 19. The curved surface 191s3 may be higher than the surface of each of the pads 11p with respect to the second surface 11s2 of the carrier 11 facing away from the protection layer 19. An elevation of the surface 11p3s of the pad 11p3 may be lower than that of the recess of the blocking structure 193 with respect to the surface 11s2 of the carrier 11 facing away from the protection layer 19.

The opening 19o1 may be disposed between the recesses of the blocking structures 191 and 192 of the protection layer 19. The opening 19o2 may be disposed between the recesses of the blocking structures 192 and 193 of the protection layer 19.

Figure 1B:
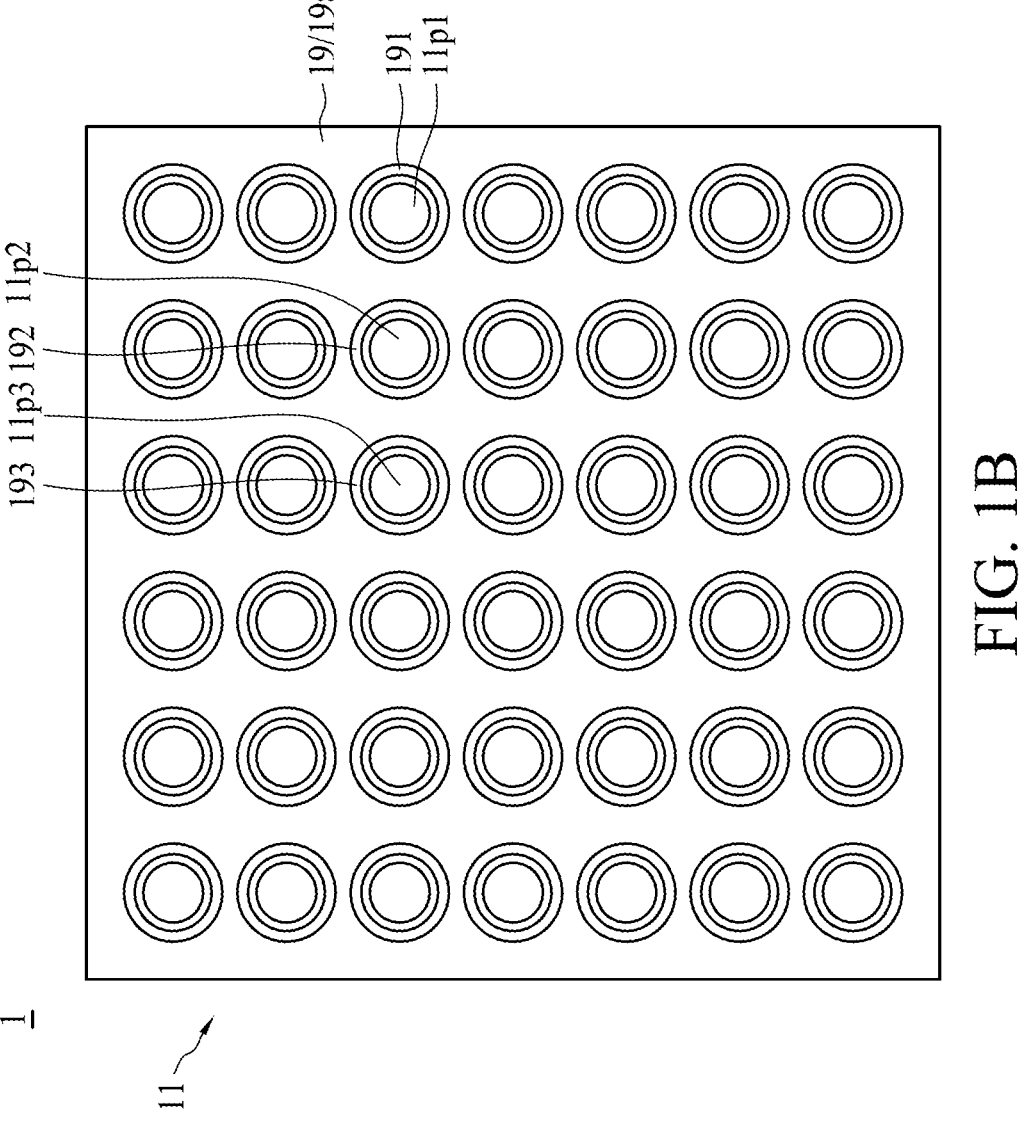
FIG. 1B is a top view of a carrier of an electronic device according to some embodiments of the present disclosure.

FIG. 1B is a top view of a carrier (e.g., the carrier 11) of an electronic device (e.g., the electronic device 1) according to some embodiments of the present disclosure. The pads 11p (including the first pad 11p1, the second pad 11p2, and the third pad 11p3) may have a circular shape in the top view. In some embodiments, the pads 11p may have different shapes, e.g., oval, rectangular, triangular, etc. The blocking structures 191, 192, and 193 may extend around the first pad 11p1, the second pad 11p2, and the third pad 11p3, respectively. The blocking structures 191, 192, and 193 may include a ring recess in a top view.

Figure 1C:
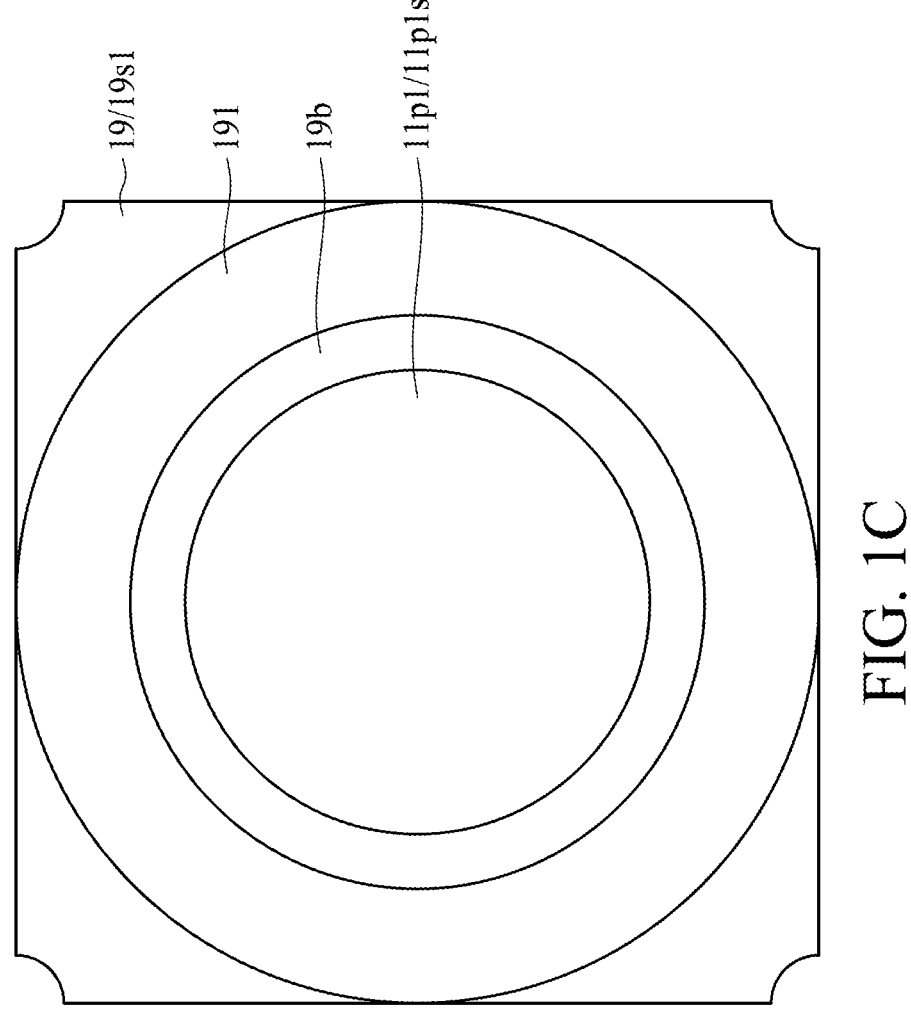
FIG. 1C is an enlarged top view of a region around a pad in FIG. 1B.

The blocking structures 191, 192, and 193 may be spaced apart from the first pad 1p1, the second pad 11p2, and the third pad 11p3, respectively. FIG. 1C is an enlarged view of a region around a pad (e.g., the first pad 11p1) in FIG. 1B. The blocking structure 191 may be spaced apart from the first pad 11p1 with the protection layer 19 (or a portion 19b). In some embodiments, the blocking structure 191 may be spaced apart from the surface 11p1s of the first pad 11p1 with the portion 19b of the protection layer 19.

The width of the ring recess of the blocking structure 191 may be around 100 m in the top view. The width of the portion 19b of the protection layer 19 may be around 50 m in the top view. The diameter of the surface 11p1s may be around 250 m in the top view.

Referring back to FIG. 1A, a trench 11t1 may be located between the first pad 11p1 and the second pad 11p2 for separating the first pad 11p1 and the second pad 11p2, and may be under the blocking structure 191. The blocking structure 191 may be within the trench 11t1. In some embodiments, the protection layer 19 may be disposed within and above the trench 11t1 to form the blocking structure 191. The blocking structure 191 may be disposed within and above the trench 11t1. The two sides 11p1a and 11p2a of the first pad 11p1 may have a concave shape which is defined by the formation of the trench 11t1. The protection layer 19 may be taper at one side closer to the pad 11p1. The protection layer 19 may have a smooth profile.

A trench 11t2 may be located between the second pad 11p2 and the third pad 11p3 for separating the second pad 11p2 and the third pad 11p3, and may be under the blocking structure 192. The blocking structure 192 may be within the trench 11t2. In some embodiments, the protection layer 19 may be disposed within and above the trench 11t2 to form the blocking structure 192. The blocking structure 192 may be disposed within and above the trench 11t2. Two sides of the second pad 11p2 may have a concave shape which is defined by the formation of the trench 11t2. A trench 11t3 may be located between the third pad 11p3 and another pad for separating the third pad 11p3 and the other pad, and may be under the blocking structure 193. The blocking structure 193 may be within the trench 11t3. In some embodiments, the protection layer 19 may be disposed within and above the trench 11t3 to form the blocking structure 193. The blocking structure 193 may be disposed within and above the trench 11t3. Two sides of the third pad 11p3 may have a concave shape which is defined by the formation of the trench 11t3. The carrier 11 may include a first conductive layer 11c1, a second conductive layer 11c2, and a third conductive layer 11c3. The first conductive layer 11d1 may define the trench 11t1 and the pad 11p1. The second conductive layer 11c2 may define the trench 11t2 and the pad 11p2. The third conductive layer 11c3 may define the trench 11t3 and one of the pads 11p. The first conductive layer 11d1 may be spaced apart from the first pad 11p1 by the trench 11t1. The second conductive layer 11c2 may be spaced apart from the first pad 11p1 by the trench 11t1. The second conductive layer 11c2 may be spaced apart from the second pad 11p2 by the trench 11t2. The second conductive layer 11c2 may be disposed between the first pad 11p1 and the second pad 11p2. The third conductive layer 11c3 may be spaced apart from the second pad 11p2 by the trench 11t2. The third conductive layer 11c3 may be spaced apart from the third pad 11p3 by the trench 11t3. The third conductive layer 11c3 may be disposed between the second pad 11p2 and the third pad 11p3.

In some embodiments, the first conductive layer 11c1, the second conductive layer 11c2, and the third conductive layer 11c3 are spaced apart from the first pad 11p1, the second pad 11p2, and the third pad 11p3 by the protection layer 19.

The first conductive layer 11c1, the second conductive layer 11c2, or the third conductive layer 11c3 may be an electrically grounding layer. The electrically grounding layer 11c2 may be disposed between the first pad 11p1 and the second pad 11p2. The electrically grounding layer 11c3 may be disposed between the second pads 11p2 and the third pad 11p3.

Figure 8A:
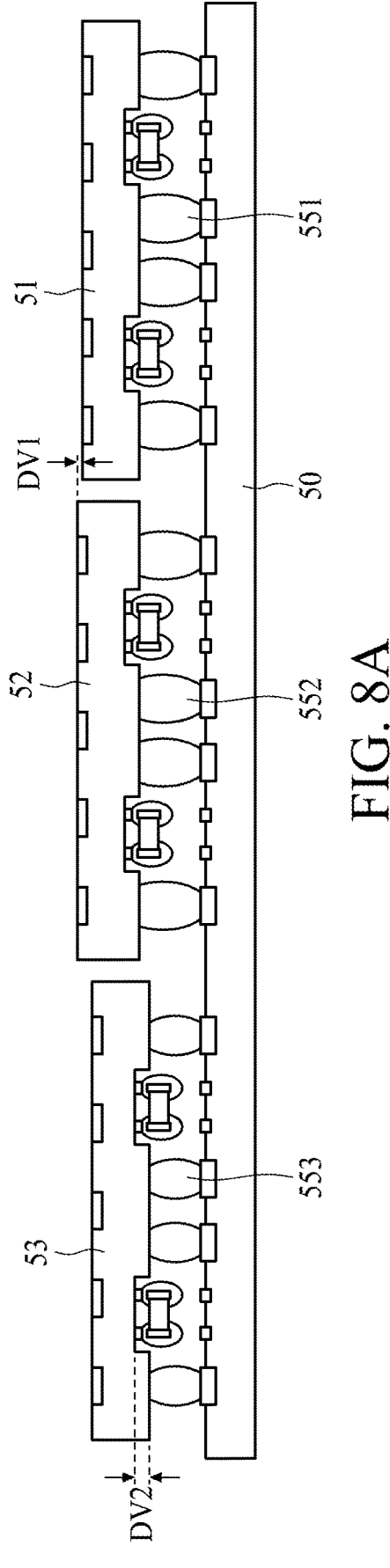
FIG. 8A illustrates a plurality of carriers mounted on a mother board according to some embodiments of the present disclosure.

FIG. 8A illustrates a plurality of carriers 51, 52, and 53 mounted on a mother board 50 according to some embodiments of the present disclosure. The carriers 51 and 52 may have a thickness deviation DV1. When the carriers 51 and 52 are respectively mounted to the mother board 50 by solder bumps, there is a process deviation DV2 induced by the solder bumps (or SMT). Thus, the upper surfaces of the carriers 51, 52, and 53 that face away from the mother board 50 may not be at the same elevation because of the thickness deviation DV1 and the process deviation DV2.

Figure 8B:
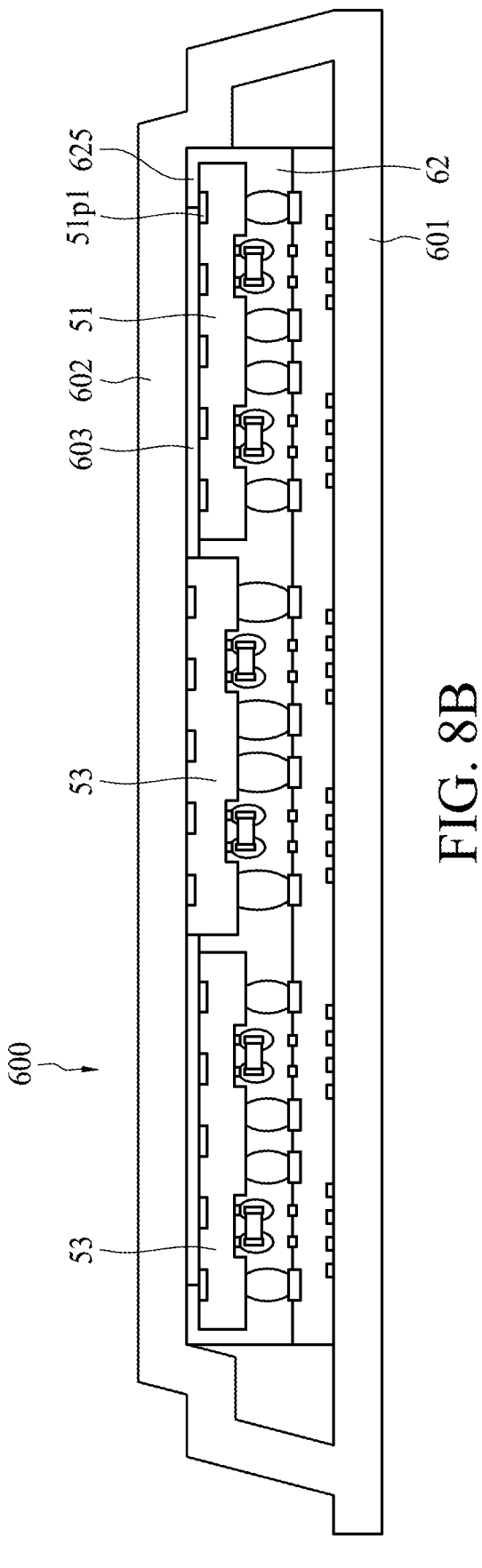
FIG. 8B illustrates a structure of FIG. 8A with the application of an encapsulation layer according to some embodiments of the present disclosure.

FIG. 8B illustrates a structure of FIG. 8A with the application of an encapsulation layer 62 according to some embodiments of the present disclosure. A tool 600 is for applying the encapsulation layer 62 onto the structure as shown in FIG. 8A. The tool 600 may include a bottom mold 601 and a top mold 602 opposite to the bottom mold 601. The structure of FIG. 8A may be placed on the bottom mold 601 and the top mold 602 may press the structure of FIG. 8A. The tool 600 may include a release film 603 disposed on a surface of the top mold 602 and is used to easily release the structure of FIG. 8A after the application of the encapsulation layer 62. In some embodiments, the release film 603 may be flexible, such that it can compensate for a part of the thickness deviation DV1 and a part of the process deviation DV2

When the structure of FIG. 8A is fastened in the tool 600, the encapsulation layer 62 is then applied into the space between the mother board 50 and the carriers 51, 52, and 53. The encapsulation layer 62 may be applied onto the lateral surfaces of the carriers 51, 52, and 53. Owing to the height differences of the carriers 51, 52, and 53, a portion 625 of the encapsulation layer 62 climbs over the upper surfaces of the carrier 51 and 53 which are shorter than the carrier 52. The portion (or climbing portion) 625 of the encapsulation layer 62 climbs from the periphery region of the carriers 51 and 53 and partially covers at least one of the pads at the upper surfaces of the carriers 51 and 53. The pads (e.g., one or more pads 591) at the periphery region of the carriers 51 and 53 may be more likely to be covered by the climbing portion 625. Hence, the climbing portion 625 of the encapsulation layer 62 may fully or partially cover one or more of the pads prior to the formation of solder bumps. The climbing portion 625 would hinder the connection between the pads and the solder bumps.

Figure 8C:
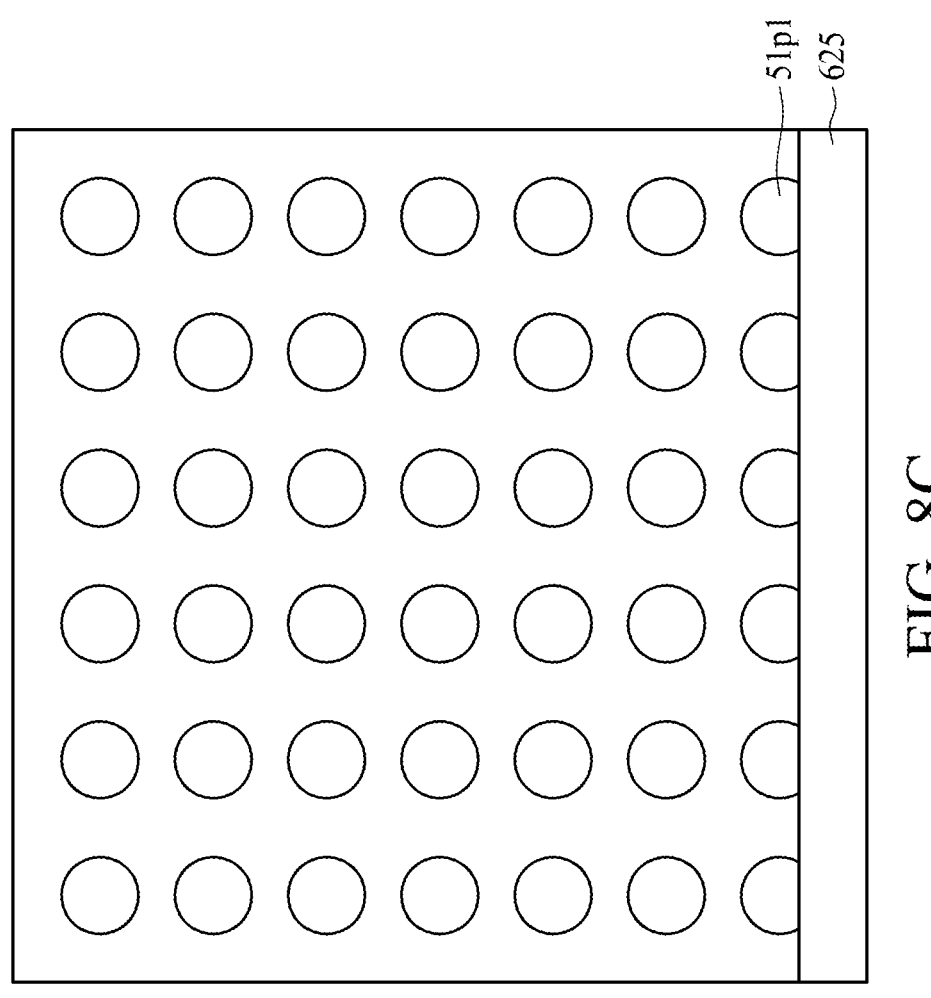
FIG. 8C illustrates a top view of one of the carriers after the application of an encapsulation layer.

FIG. 8C illustrates a top view of one of the carriers (e.g., the carrier 51) after the application of an encapsulation layer (e.g., the encapsulation layer 62). As shown in FIG. 8C, the portion 625 of the encapsulation layer 62 may partially cover one or more pads 51p1. In a worst case scenario, the portion 625 may extend over the pad 51p1 and arrive at the inner pads.

Figure 8D:
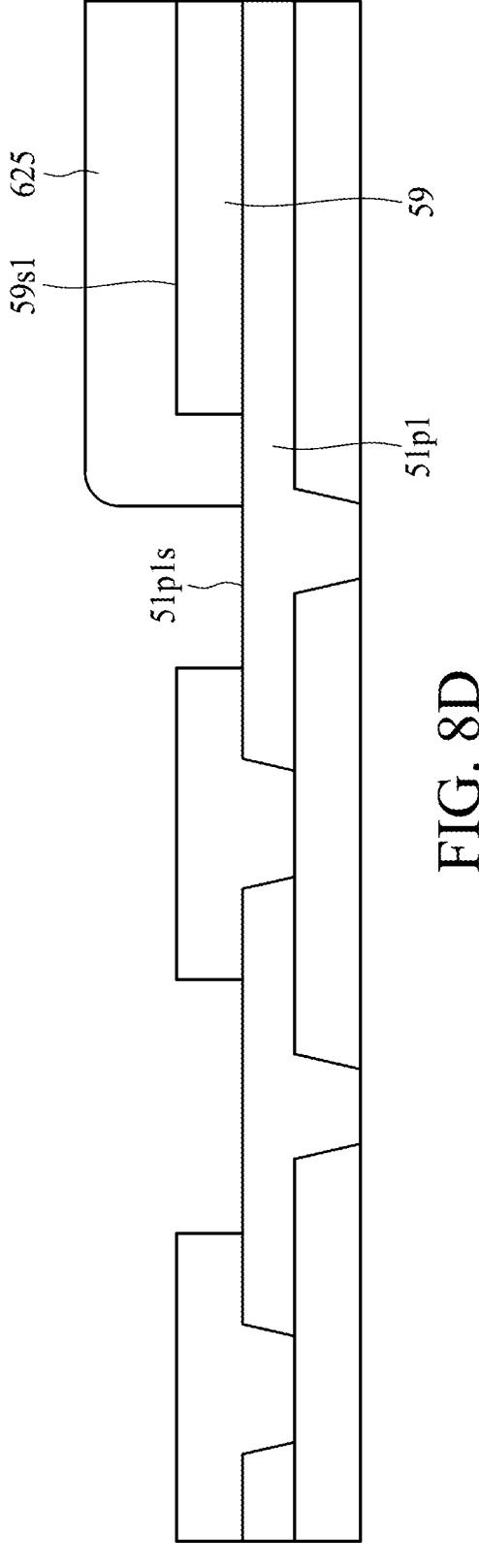
FIG. 8D illustrates an enlarged cross-sectional view of one of the carriers after the application of an encapsulation layer.

FIG. 8D illustrates an enlarged cross-sectional view of a portion of one of the carriers (e.g., the carrier 51) after the application of an encapsulation layer (e.g., the encapsulation layer 62). As shown in FIG. 8D, the portion 625 of the encapsulation layer 62 may extend over a surface 59s1 of a protection layer 59 of the carrier 51 and arrive at a surface 51p1s of the pad 51p1, which is used for the connection with a connection element (e.g., a solder bump). This would hinder the connection between the pad 51p1 and the solder bump since the climbing portion 625 and the solder bump cannot form a bond therebetween. The insulative climbing portion 625 obscures the electrical connection between the pad 51p1 and the solder bump. Even though the pad 51p1 may partially connect the solder bump while the climbing portion 625 partially covers the pads 51p1, the bonding between the pad 51p1 and the solder bump is weak, leading to de-bonding of the solder bump. In some cases, an extra laser etching or polishing process may be applied to remove the climbing portion 625 prior to mounting the solder bump. Nevertheless, these remedies would increase the possibility of delamination of the protection layer 59 because of additional heat and/or increase the manufacturing cost.

Figure 1D:
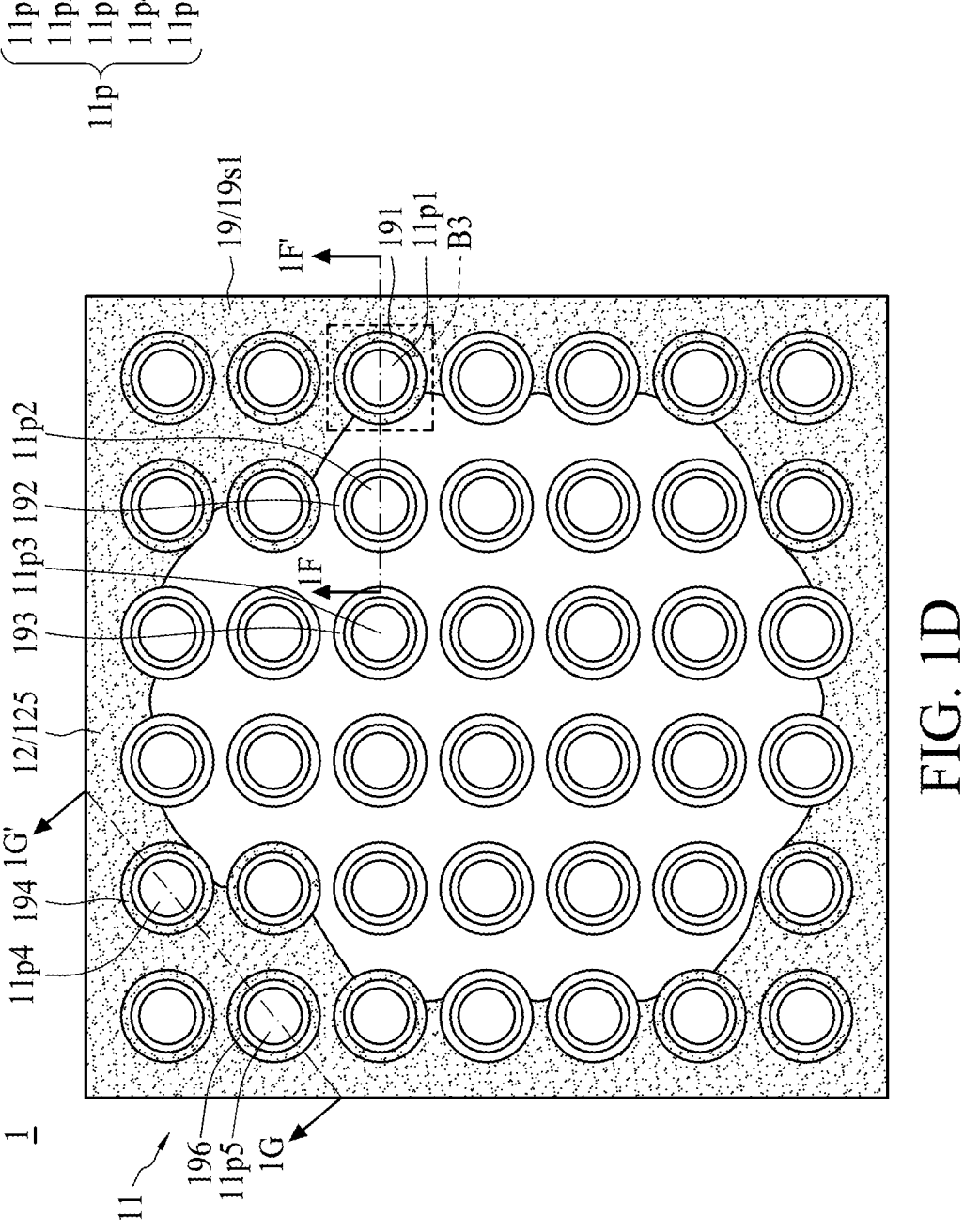
FIG. 1D is a top view of a carrier of an electronic device in which an encapsulation layer is on a protection layer, according to some embodiments of the present disclosure.

FIG. 1D is a top view of a carrier (e.g., the carrier 11) of an electronic device (e.g., the electronic device 1) in which an encapsulation layer (e.g., the encapsulation layer 12) is on a protection layer (e.g., the protection layer 19) according to some embodiments of the present disclosure.

The plurality of pads 11p may form an array at the surface 11s1 of the carrier 11. The encapsulation layer 12 may cover a periphery region of the carrier 11. In some embodiments, the climbing portion 125 of the encapsulation layer 12 climbs from the edge of the carrier 11 and spreads over the periphery region of the carrier 11. The periphery region of the carrier 11 includes the corners and the perimeters of the surface 11s1. Since the warpage of the carrier 11 is greater in its corners than the perimeters, the encapsulation layer 12 may extend in a longer length in the corners. For example, in the corners, the encapsulation layer 12 extends to the area at the second outermost pad; in the perimeters, the encapsulation layer 12 extends to the area at the first outermost pad. The encapsulation layer 12 may be formed by a molding process and a curing process. The boundary of the encapsulation layer 12 over the surface 11s1 may be irregular.

The protection layer 19 may be configured to block the encapsulation layer 12 from covering the pads 11p. In some embodiments, the protection layer 19 may include blocking structures 191, 192, 193, 194, and 196, each of which surrounds pads 11p1, 11p2, 11p3, 11p4, and 11p5, respectively. The blocking structures 191, 192, 193, 194, and 196 may be adjacent to the plurality of pads 11p. The blocking structures 191, 192, 193, 194, and 196 may be configured to block the encapsulation layer 12 (or the climbing portion 125) from covering the corresponding pads. The blocking structures 191, 192, 193, 194, and 196 may be configured to accommodate excessive amount of the encapsulation layer 12 (or the climbing portion 125) and thus no encapsulation layer 12 would enter the exposed areas of the pads 11p1, 11p2, 11p3, 11p4, and 11p5, e.g., the openings 19o1 and 19o2 in FIG. 1F and the openings 19o3 and 19o4 in FIG. 1G. In the top view, the encapsulation layer 12 may be disposed between the plurality of pads 11p. The pads 11p1, 11p2, 11p3, 11p4, and 11p5 may be spaced apart from the encapsulation layer 12. The encapsulation layer 12 may be disposed at the periphery areas (or surrounding areas) of at least one of the pads 11p1, 11p4, and 11p5 (e.g., the exposed area thereof).

Figure 1E:
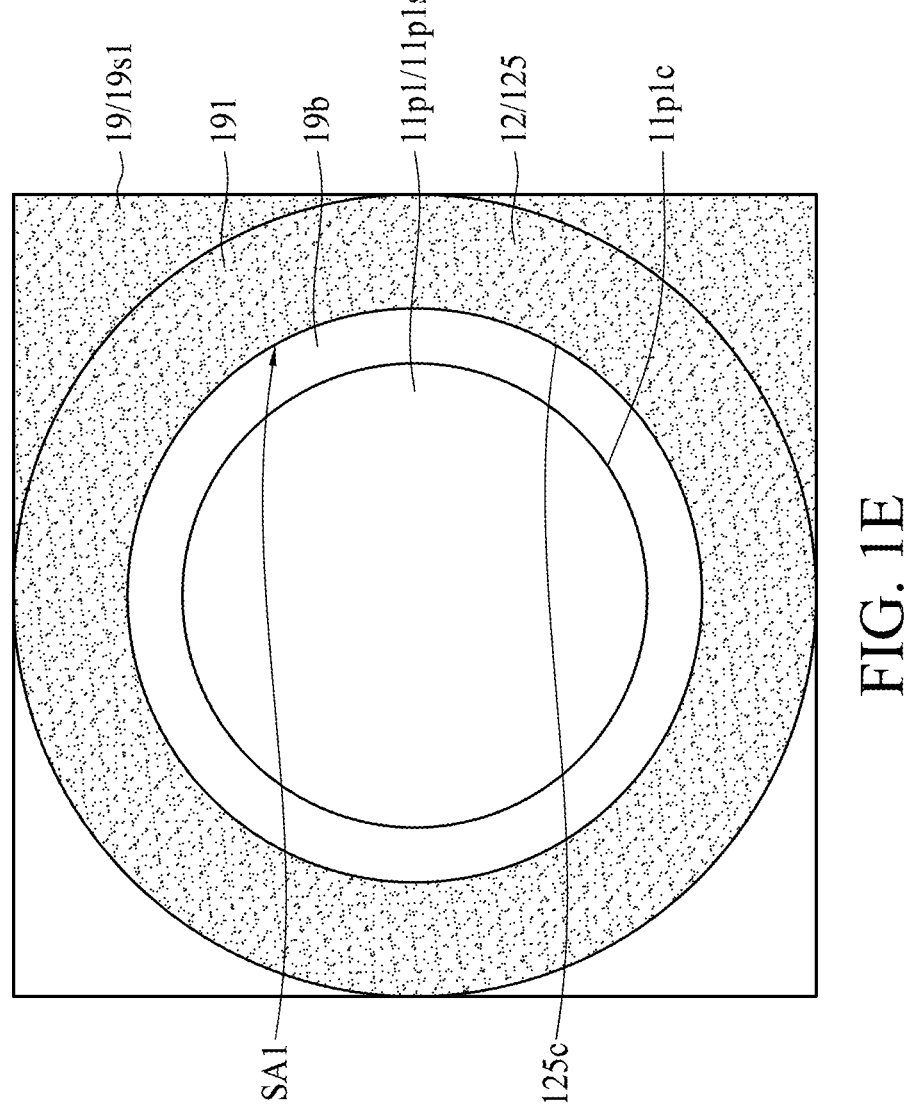
FIG. 1E is an enlarged top view of a region around a pad in FIG. 1D.

FIG. 1E is an enlarged top view of a region around a pad (e.g., the first pad 11p1) in FIG. 1D. In the top view of FIG. 1E, the portion 125 of the encapsulation layer 12 may be disposed at a periphery area (or a surrounding area) SA1 of at least one pad of the pads. The periphery area (or the surrounding area) SA1 is defined as the suburbs of the first pad 11p1 free from overlapping the exposed area of the first pad 11p1 in the top view. For example, the periphery area (or the surrounding area) SA1 may include the blocking structure 191. The surrounding area SA1 may exclude the portion 19b.

In the top view, the portion 125 of the encapsulation layer 12 has an inner contour 125c substantially identical to an outer contour 11p1c of the first pad 11p1. The inner contour 125c of the encapsulation layer 12 may be defined by the contour of the blocking structure 191. In the top view, the inner contour 125c of the portion 125 of the encapsulation layer 12 may have a first curvature substantially identical to a second curvature of the outer contour 11p1c of the first pad 11p1. Although FIG. 1E shows the circular contour of the pad 11p1, but does not limit the scope of the present disclosure. The pad 11p1 (and the pads 11p) may have a rectangular, triangle, oval contour, etc. The inner contour of the encapsulation layer 12 and the contour of the blocking structure 191 may correspond to the contour of the pad 11p1.

Figure 1F:
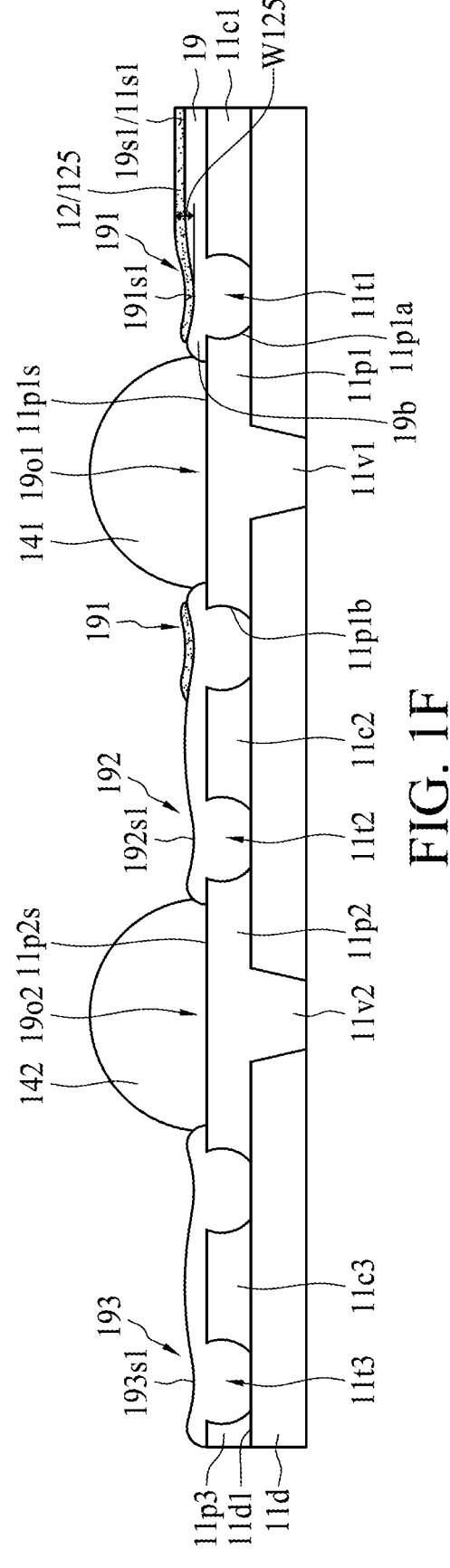
FIG. 1F is an enlarged cross-sectional view of a structure of a box B1 in FIG. 1 in which an encapsulation layer is on a protection layer, according to some embodiments of the present disclosure.

FIG. 1F is an enlarged view of a structure of a box B1 in FIG. 1 in which an encapsulation layer (e.g., the encapsulation layer 12) is on a protection layer (e.g., the protection layer 19). The enlarged cross-sectional view of FIG. 1F may be viewed along line 1F-1F' in FIG. D. The encapsulation layer 12 may partially cover the first surface 11s1 of the carrier 11 or the surface 19s1 of the protection layer 19. The encapsulation layer 12 may include a portion (or a climbing portion) 125 disposed on the blocking structure 191 of the protection layer 19. The portion 125 may be disposed between the first pad 11p1 and the second pad 11p2. The protection layer 19 may be disposed between the carrier 11 and the encapsulation layer 12.

The blocking structure 191 may be configured to block the encapsulation layer 12 from covering the first pad 11p1. The blocking structure 191 may be configured to accommodate the encapsulation layer 12 (or the portion 125). The encapsulation layer 12 (or the portion 125) may partially cover the recess of the blocking structure 191. The portion 125 may be blocked from covering the surface 11p1s of the first pad 11p1 prior to the formation of the first connection element 141. The portion 125 that climbs from the edge of the carrier 11 would not impact the connection of the first pad 11p1 and the first connection element 141. Therefore, the first connection element 141 and the first pad 11p1 may have a robust connection. The surface 11p1s of the first pad 11p1 is exposed by the protection layer 19, and the portion 125 does not extend into the area over the surface 11p1s. No additional remedies (e.g., laser etching or polishing) are required for the removal of the climbing portion 125. The blocking structures 192 and 193 may be configured to block the encapsulation layer 12 from covering the corresponding pad (i.e., the second pad 11p2 and the third pad 11p3). The location of the blocking structures 191, 192, and 193 respectively correspond to the trenches 11t1, 11t2, and 11t3. The trenches 11t1, 11t2, and 11t3 may be defined in the same patterning process for forming the pads 11p. Thus, no additional patterning process (in other words, no additional mask) is required. Thus, the manufacturing cost can be kept low.

In some embodiments, the portion 125 may be spaced apart from the first connection element 141. In some embodiments, a clearance region C1 may be defined between the encapsulation layer 12 (or the portion 125) and the first connection element 141. No portion of the encapsulation layer 12 is disposed in the clearance region C1.

As shown in FIG. 1F, a thickness W125 of the encapsulation layer 12 (or the portion 125) may be thicker at one side closer to the blocking structure 191. The thickness of the encapsulation layer 12 (or the portion 125) may be taper at one side closer to the blocking structure 191. The encapsulation layer 12 may be piled up in the recess of the blocking structure 191. In some embodiments, the encapsulation layer 12 may fill in the recess of the blocking structure 191.

Figure 1G:
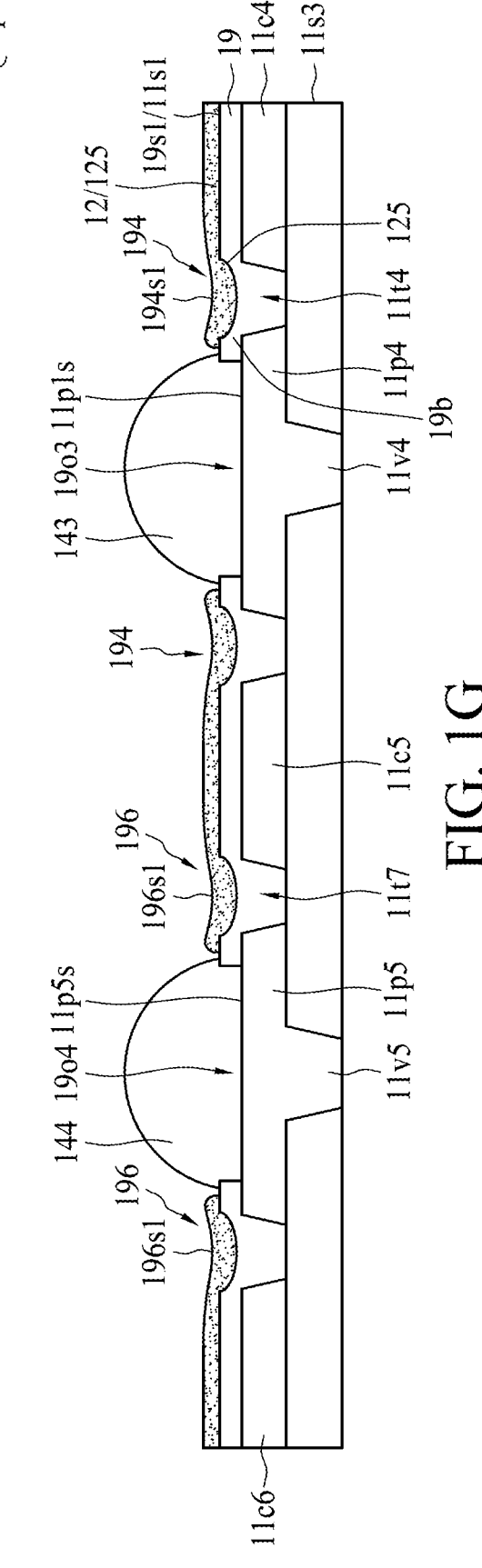
FIG. 1G is an enlarged cross-sectional view of a structure of a box B1 in FIG. 1, in which an encapsulation layer is on a protection layer, according to some embodiments of the present disclosure.

FIG. 1G is an enlarged cross-sectional view of a structure of a box B1 in FIG. 1, in which an encapsulation layer is on a protection layer, according to some embodiments of the present disclosure. The encapsulation layer 12 may cover the blocking structures 194 and 196. The blocking structures 194 and 196 may each include a recess. The blocking structures 194 and 196 may be disposed between the pads 11p4 and 11p5. The encapsulation layer 12 may extend between the recess of the blocking structure 194 and the recess of the blocking structure 196.

Connection elements 143 and 144 may be respectively disposed within the openings 19o3 and 19o4. The connection elements 143 and 144 may be respectively disposed over the surfaces 11p3s and 11p4s of the pads 11p3 and 11p4. The connection elements 143 and 144 may be connected to the pads 11p3 and 11p4. The pads 11p3 and 11p4 may be connected to vias 11v4 and 11v5. The carrier 11 may include a conductive layers 11c4, 11c5, and 11c6. The conductive layer 11c4 may define the trench 11t4 and the pad 11p4. The conductive layer 11c5 may define the trench 11t5 and the pad 11p4. The conductive layer 11c6 may define the trench 11t7 and one of the pads 11p. In some embodiments, the protection layer 19 may be disposed within and above the trench 11t4 to form the blocking structure 194. The blocking structure 194 may be disposed within and above the trench 11t4. In some embodiments, the protection layer 19 may be disposed within and above the trench 11t7 to form the blocking structure 195. The blocking structure 195 may be disposed within and above the trench 11t7.

Figure 1H:
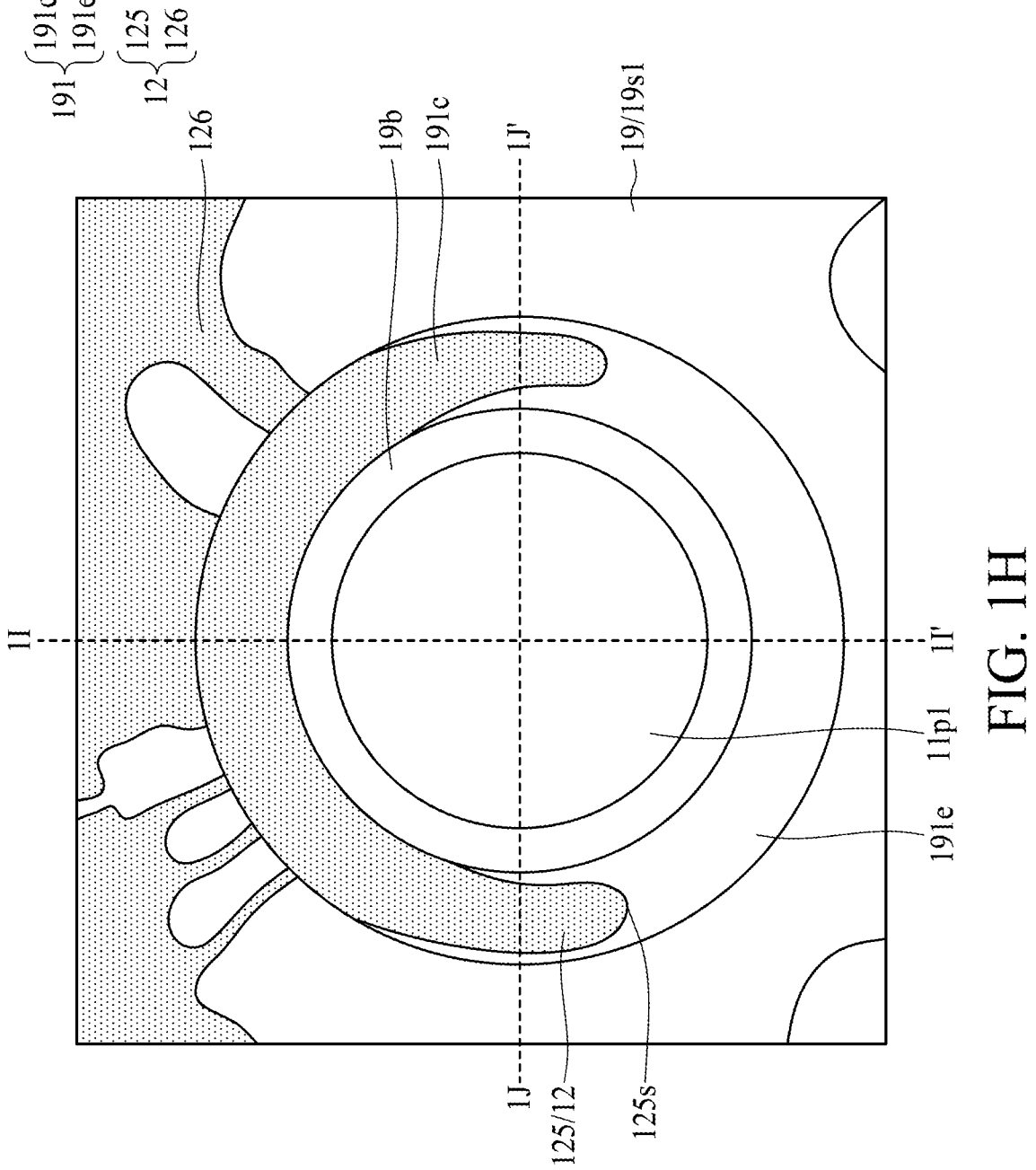
FIG. 1H is an enlarged top view of a region in a box B3 in FIG. 1D.

FIG. 1H is an enlarged top view of a region in box B3 in FIG. 1D. The blocking structure 191 may be a ring recess surrounding the first pad 11p1. The encapsulation layer 12 may partially cover the ring recess (i.e., the blocking structure 191). The encapsulation layer 12 (or the portion 125) may cover a first section 191c of the ring recess (i.e., the blocking structure 191) and exposing a second section 191e of the ring recess. The encapsulation layer 12 (or the portion 125) has a curved surface 125s at a boundary of the first section 191c and the second section 191e. The encapsulation layer 12 may further include a portion 126 that spreads over the surface 19s1 of the protection layer 19. The portion 126 may have marks (similar to water marks) that are formed after the flow and curing process. The portion 126 may be connected to the portion 125. During the application of the encapsulation layer 12, the encapsulation layer 12 is bleeding over the surface 19$s$1 of the protection layer 19, and some part of the encapsulation layer 12 flows into the ring recess of the blocking structure 191 and rest there to form the portion 125, leaving the marks of the portion 126. The blocking structure 191 may be covered by the encapsulation layer 12 and the second section (or portion) 191$e$ of the blocking structure 191 may be exposed by the encapsulation layer 12.

Figures 1I, 1J:
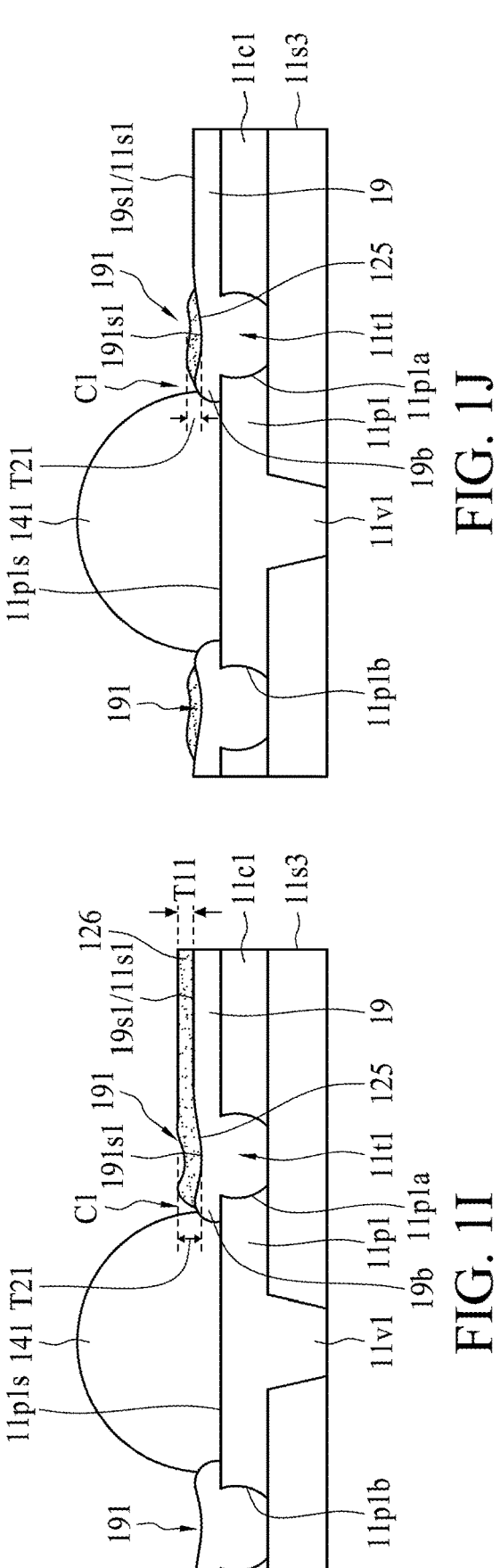
FIG. 1I is an enlarged cross-sectional view along line 1I-1I' in FIG. 1H1 in which an encapsulation layer.
FIG. 1J is an enlarged cross-sectional view along line 1J-1J' in FIG. 1H.

FIG. 1I is an enlarged cross-sectional view along line 1I-1I' in FIG. 1H. The portion 126 may extend from the lateral surface 11$s$3 of the carrier 11 to the blocking structure 191. The portion 126 may be continuous with the portion 125. The portion 125 may have a thickness T21 greater than a thickness T11 of the portion 126, because the portion 125 is piled up in the recess of the blocking structure 191.

FIG. 1J is an enlarged cross-sectional view along line 1J-1J' in FIG. 1G. The portion 125 of the encapsulation layer 12 may be disposed within the recess of the blocking structure 191. The encapsulation layer 12 may be spaced apart from the connection element 14 (see the clearance region C1). The portion 125 of the encapsulation layer 12 may be disposed at a surrounding area of the first pad 11$p$1.

Figure 2A:
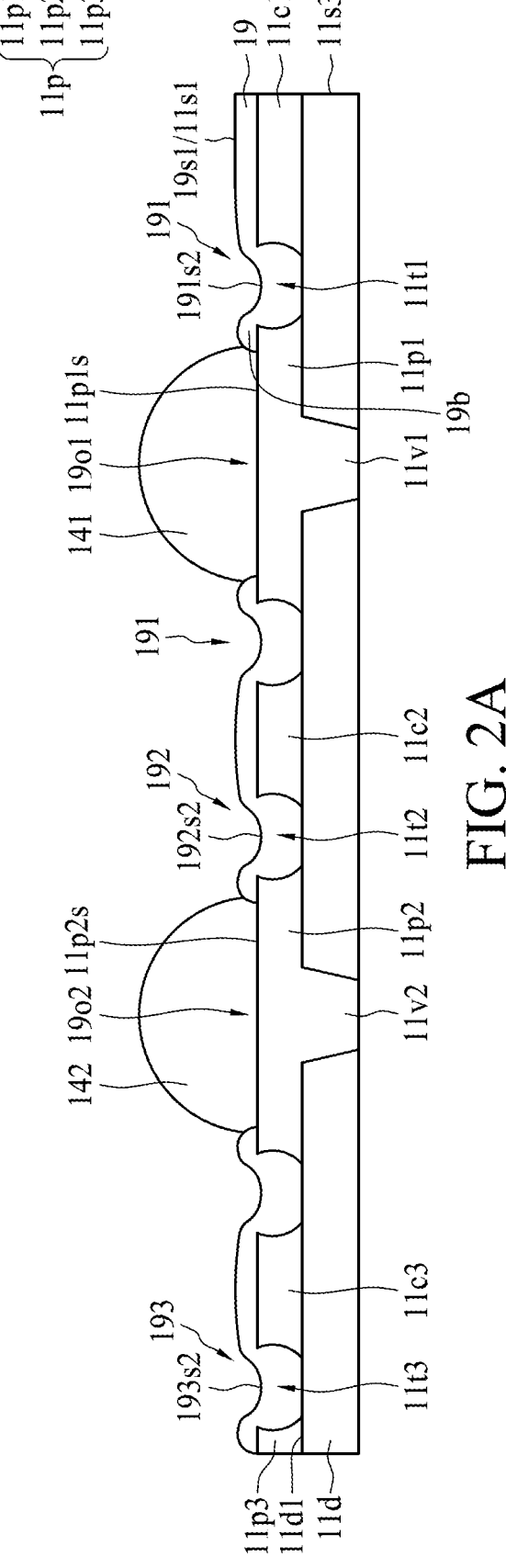
FIG. 2A is another enlarged cross-sectional view of a structure in a box B1 in FIG. 1.

FIG. 2A is another enlarged cross-sectional view of a structure in a box B1 in FIG. 1. The structure of FIG. 2A is similar to the structure in FIG. 1A. Therefore, some detailed descriptions may refer to corresponding preceding paragraphs and are not repeated hereinafter for conciseness, with differences therebetween as follows.

As shown in FIG. 2A, the blocking structure 191 may have a curved surface 191$s$2 having a bottom point substantially at the same elevation as the surface 11$p$ is of the first pad 11$p$1. The (ring) recess of the blocking structure 191 may be deeper than that in FIG. 1A, and thus the blocking structure 191 may have a larger volume to accommodate the climbing portion (e.g., 125) of the encapsulation layer 12. The blocking structure 192 may have a curved surface 192$s$2 having a bottom point substantially at the same elevation as the surface 11$p$2$s$ of the second pad 11$p$2. The blocking structure 193 may have a curved surface 193$s$2 having a bottom point substantially at the same elevation as the surface 11$p$3$s$ of the third pad 11$p$3. An elevation of the surface 11$p$1$s$ of the pad 11$p$1 may be substantially same as that of the recess of the blocking structure 191 with respect to the surface 11$s$2 of the carrier 11 facing away from the protection layer 19. The ring recesses of the blocking structure 192 and the blocking structure 193 may be deeper than those in FIG. 1A.

Figure 2B:
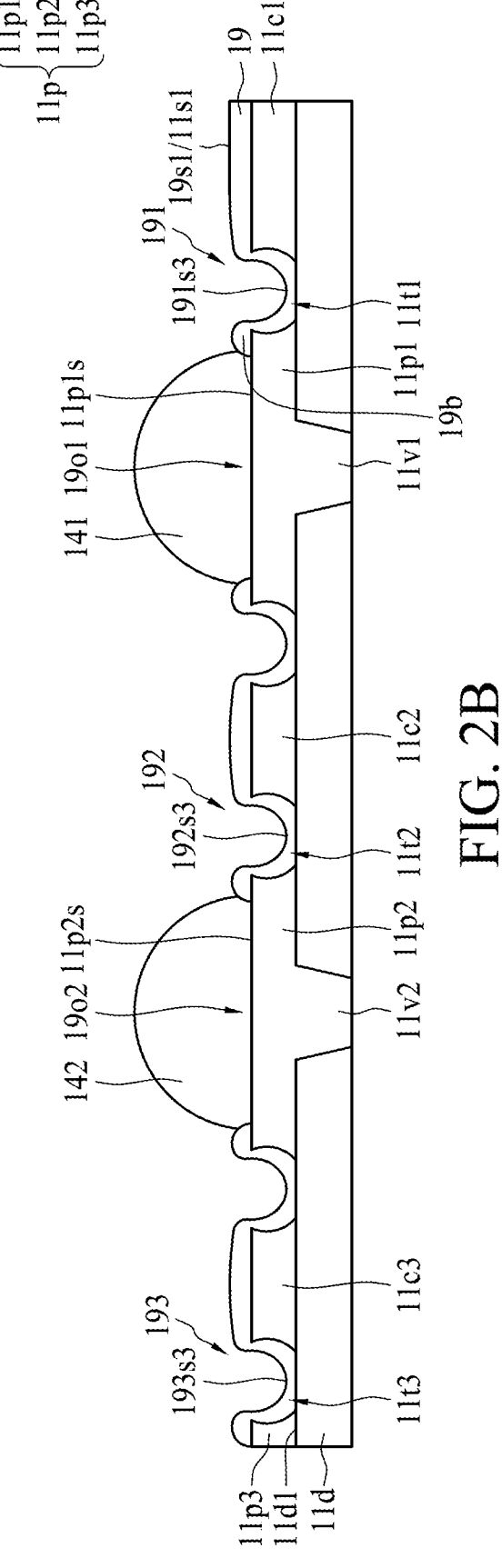
FIG. 2B is another enlarged cross-sectional view of a structure in a box B1 in FIG. 1.

FIG. 2B is another enlarged cross-sectional view of a structure in a box B1 in FIG. 1. The structure of FIG. 2B is similar to the structure in FIG. 1A. Therefore, some detailed descriptions may refer to corresponding preceding paragraphs and are not repeated hereinafter for conciseness, with differences therebetween as follows.

As shown in FIG. 2B, the blocking structure 191 may have a curved surface 191$s$3 having a bottom point substantially at an elevation lower than the surface 11$p$1$s$ of the first pad 11$p$1. The (ring) recess of the blocking structure 191 may be larger than that in FIG. 1A, and thus the blocking structure 191 may have a larger volume to accommodate the climbing portion of the encapsulation layer 12. The blocking structure 192 may have a curved surface 192$s$3 having a bottom point substantially at an elevation lower than the surface 11$p$2$s$ of the second pad 11$p$2. The blocking structure 193 may have a curved surface 193$s$3 having a bottom point substantially at an elevation lower than the surface 11$p$3$s$ of the third pad 11$p$3. An elevation of the surface 11$p$1$s$ of the pad 11$p$1 may be higher than that of the recess of the blocking structure 191 with respect to the surface 11$s$2 of the carrier 11 facing away from the protection layer 19.

Figure 2C:
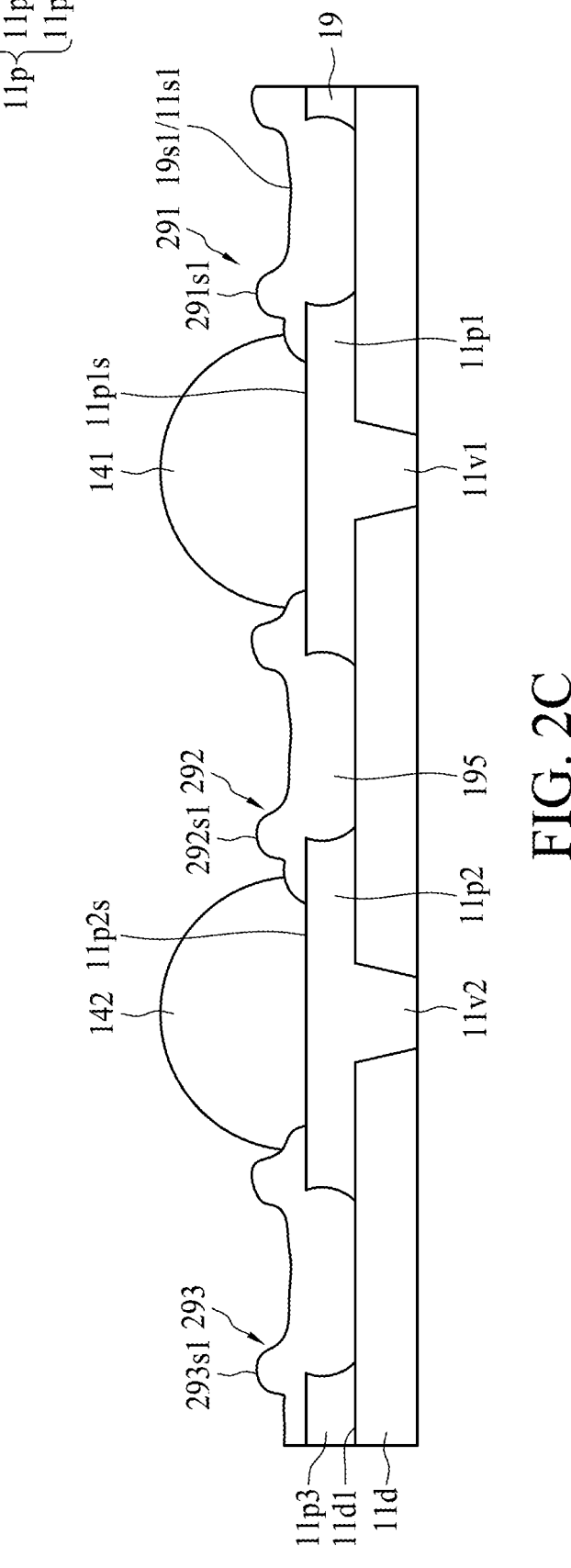
FIG. 2C is another enlarged cross-sectional view of a structure in a box B1 in FIG. 1.

FIG. 2C is another enlarged cross-sectional view of a structure in a box B1 in FIG. 1. The structure of FIG. 2C is similar to the structure in FIG. 1A. Therefore, some detailed descriptions may refer to corresponding preceding paragraphs and are not repeated hereinafter for conciseness, with differences therebetween as follows.

The first pad 11$p$1, the second pad 11$p$2, and the third pad 11$p$3 may be spaced apart from each other with a portion 195 of the protection layer 19. The location of the portion 195 may correspond to a trench 11$t$5. The trench 11$t$5 may be defined in the patterning process of the first pad 11$p$1, the second pad 11$p$2, and the third pad 11$p$3. The portion 195 disposed within the trench 11$t$5 is for isolating the first pad 11$p$1, the second pad 11$p$2, and the third pad 11$p$3.

The protection layer 19 may include a portion (a blocking structure) 291, a portion (a blocking structure) 292, and a portion (a blocking structure) 293. The blocking structure 291, 292, and 293 may protrude from the surface 19$s$1 of the protection layer 19. The blocking structure 291 may have a surface 291$s$1 higher than the surface 19$s$1 of the protection layer 19. The blocking structure 292 may have a surface 292$s$1 higher than the surface 19$s$1 of the protection layer 19. The blocking structure 293 may have a surface 293$s$1 higher than the surface 19$s$1 of the protection layer 19. Each of the blocking structures 291, 292, and 293 may have a wall. The height of the wall may be around 20 μm. The blocking structures 291, 292, and 293 may be configured to block the encapsulation layer 12 from covering the pads 11$p$. The blocking structures 291, 292, and 293 may barricade the encapsulation layer 12 (e.g., the climbing portion), such that the possibility of the encapsulation layer 12 arriving at the pads 11$p$ is lessened.

The blocking structures 291, 292, and 293 may be respectively disposed at two sides of the first pad 11$p$1, the second pad 11$p$2, and the third pad 11$p$3. The blocking structure 291 may be disposed between the first pad 11$p$1 and the second pad 11$p$2. The blocking structure 292 may be disposed between the first pad 11$p$1 and the second pad 11$p$2. The blocking structure 292 may be disposed between the second pad 11$p$2 and the third pad 11$p$3. The blocking structure 291 may be disposed between the blocking structure 292 and the first pad 11$p$1. The blocking structure 292 may be disposed between the blocking structure 293 and the second pad 11$p$2.

Figure 2D:
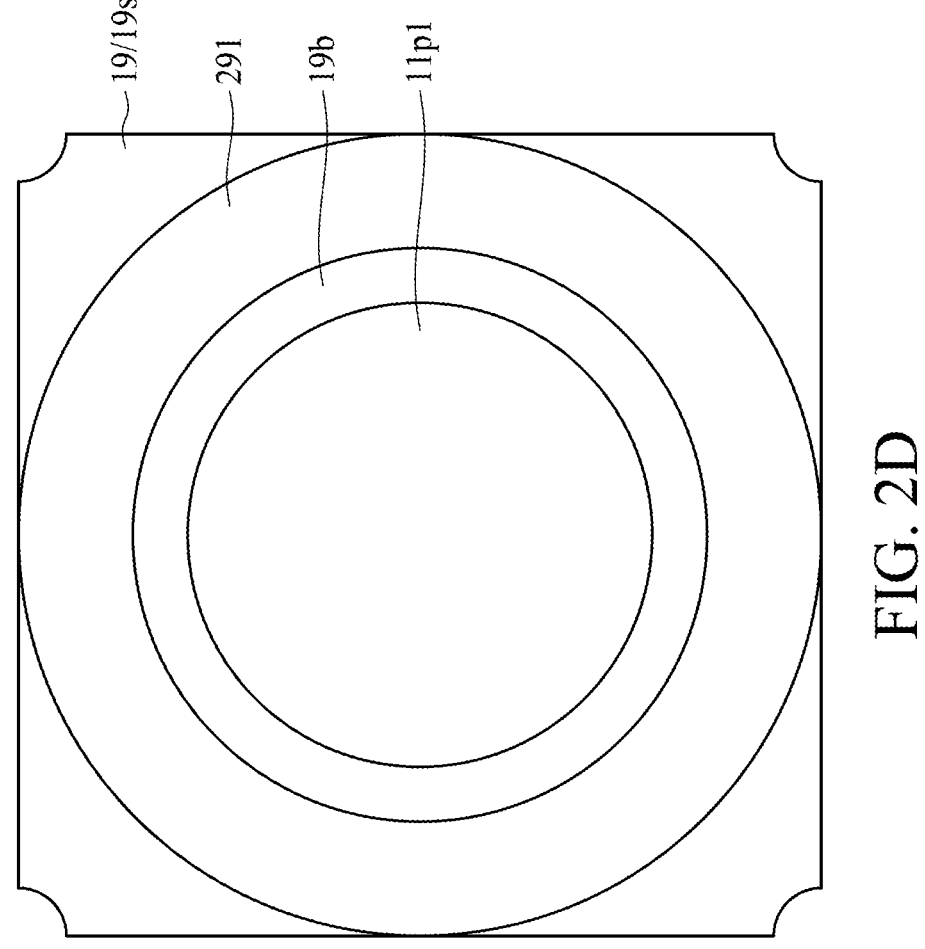
FIG. 2D is an enlarged top view of a region around a pad in FIG. 2C.

The blocking structures 291, 292, and 293 may be spaced apart from the first pad 1$p$1, the second pad 11$p$2, and the third pad 11$p$3, respectively. FIG. 2D is an enlarged top view of a region around a pad (e.g., the first pad 11$p$1) in FIG. 2C. The blocking structure 291 may be spaced apart from the first pad 11$p$1 with the protection layer 19 (or a portion 19$b$). In some embodiments, the blocking structure 291 may be spaced apart from the surface 11$p$1$s$ of the first pad 11$p$1 with the portion 19$b$ of the protection layer 19. The width of the wall of the blocking structure 291 may be around 100 μm in the top view.

Figure 3A:
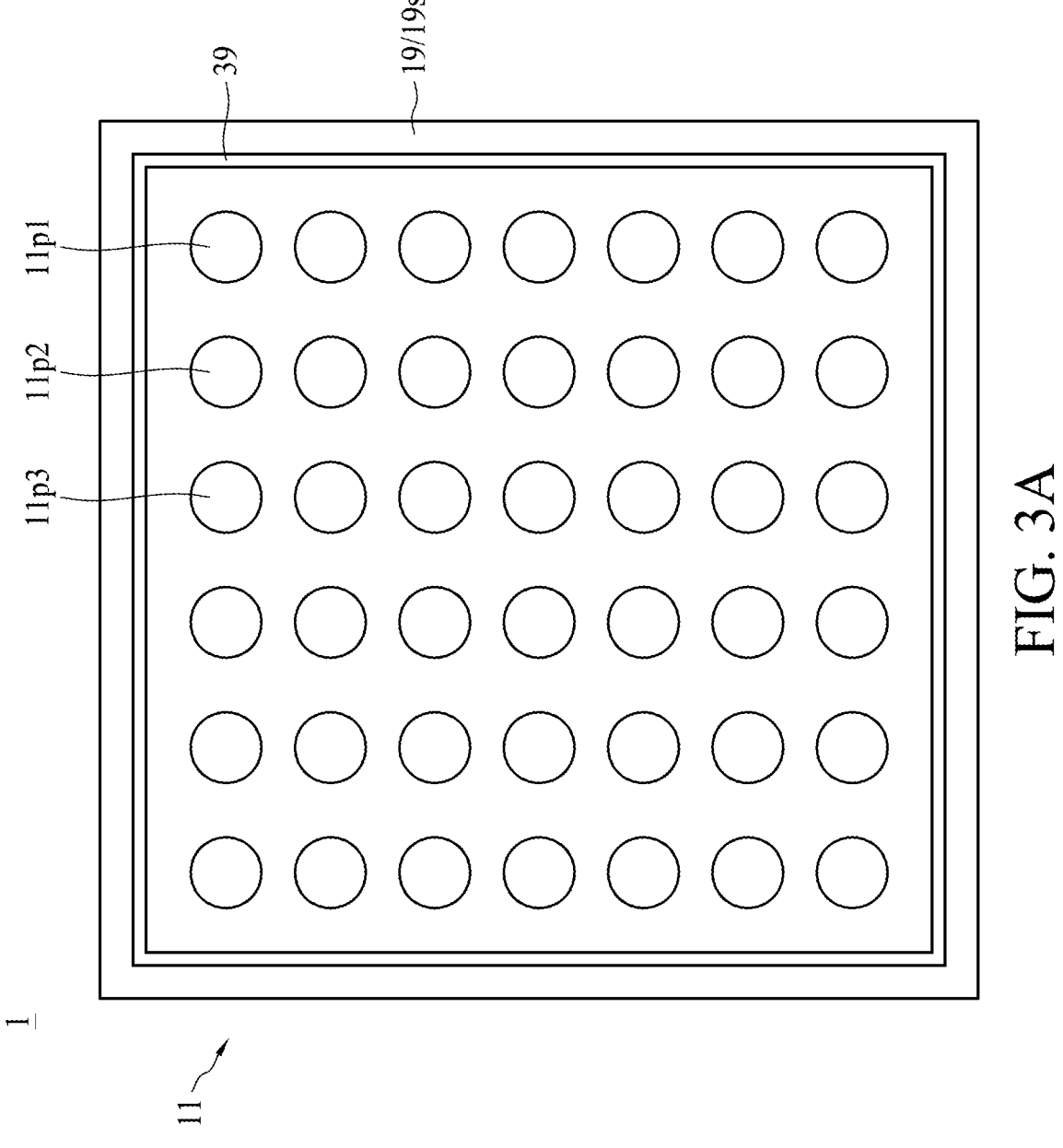
FIG. 3A is a top view of a carrier of an electronic device according to some embodiments of the present disclosure.

FIG. 3A is a top view of a carrier (e.g., the carrier 11) of an electronic device (e.g., the electronic device 1) according to some embodiments of the present disclosure.

As shown in FIG. 3A, the pads 11$p$ (including the first pad 11$p$1, the second pad 11$p$2, and the third pad 11$p$3) may form an array. The array may be surrounded by an outer portion (or a blocking structure) 39 of the protection layer 19. The outer portion 39 may be at the periphery region of the carrier 11. The outer portion 39 may be configured to block the encapsulation layer 12 from covering the pads 11*p*. The details will be discussed in FIG. 3B and FIG. 3C.

Figure 3B:
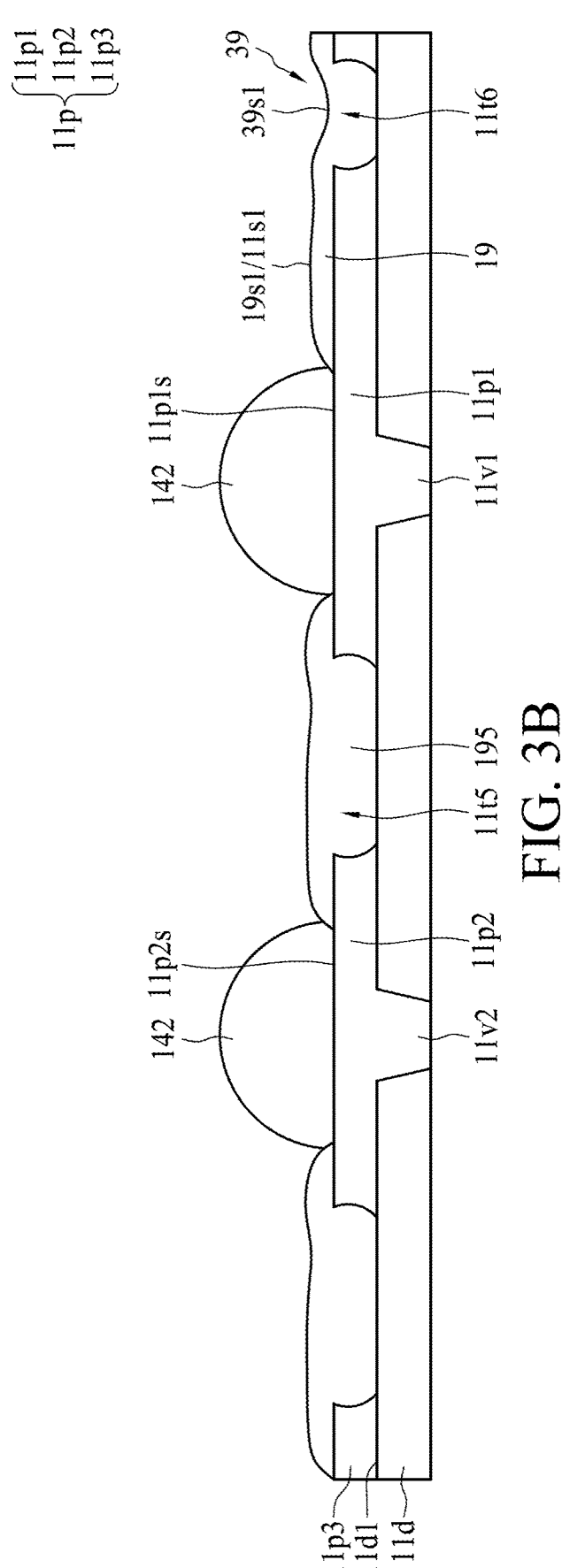
FIG. 3B is another enlarged cross-sectional view of a structure in a box B1 in FIG. 1.

FIG. 3B is another enlarged cross-sectional view of a structure in a box B1 in FIG. 1. The structure of FIG. 3B is similar to the structure in FIG. 1A. Therefore, some detailed descriptions may refer to corresponding preceding paragraphs and are not repeated hereinafter for conciseness, with differences therebetween as follows.

The protection layer 19 may include an outer portion 39, rather than the portions 191, 192, and 193. The outer portion 39 may be at the periphery region of the carrier 11. The outer portion 39 may be closer to the lateral surface 11*s*3 than the first pad 11*p*1. The outer portion 39 may include a recess.

The first pad 11*p*1, the second pad 11*p*2, and the third pad 11*p*3 may be spaced apart from each other with a portion 195 of the protection layer 19. The location of the portion 195 may correspond to a trench 11*t*5. The trench 11*t*5 may be defined in the patterning process of the first pad 11*p*1, the second pad 11*p*2, and the third pad 11*p*3. The portion 195 disposed within the trench 11*t*5 is for isolating the first pad 11*p*1, the second pad 11*p*2, and the third pad 11*p*3.

Figure 3C:
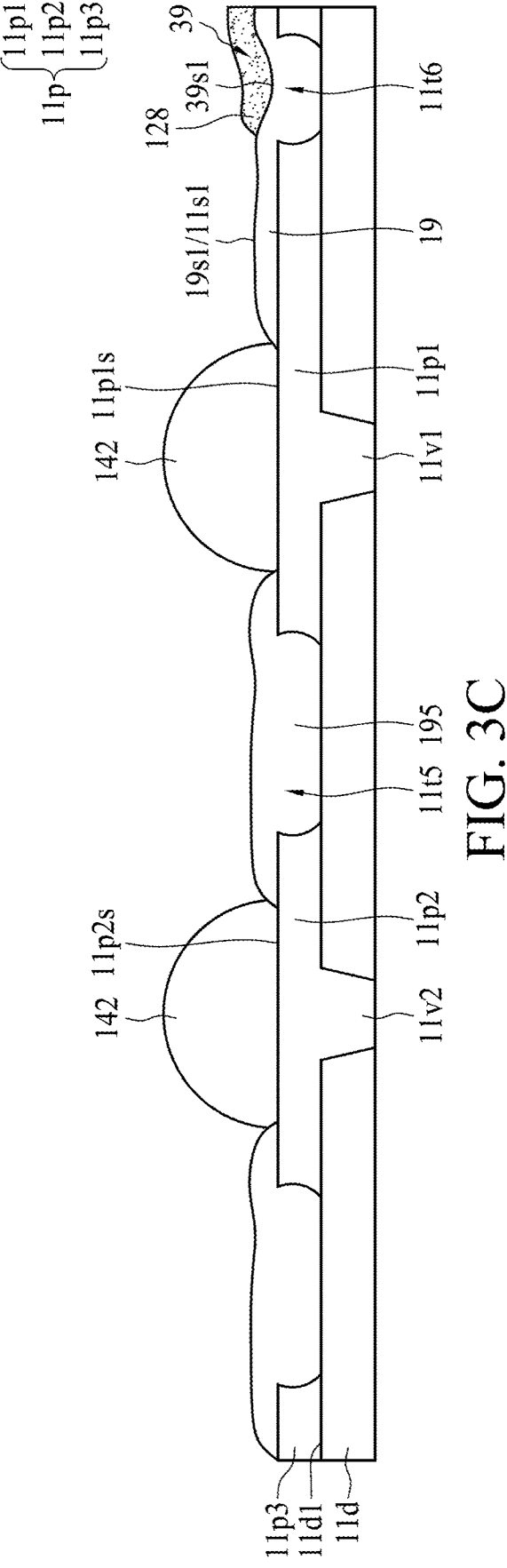
FIG. 3C is another enlarged cross-sectional view of a structure in a box B1 in FIG. 1 in which an encapsulation layer is on a protection layer.

FIG. 3C is another enlarged cross-sectional view of a structure in a box B1 in FIG. 1 in which an encapsulation layer (e.g., the encapsulation layer 12) is on a protection layer (e.g., the protection layer 19).

The encapsulation layer 12 may partially cover the first surface 11*s*1 of the carrier 11 or the surface 19*s*1 of the protection layer 19. The encapsulation layer 12 may include a portion (or a climbing portion) 128 disposed on the outer portion 39 of the protection layer 19. The outer portion 39 may be configured to block the encapsulation layer 12 from covering the pads 11*p*. The outer portion 39 may be configured to accommodate the encapsulation layer 12 (or the portion 128). The encapsulation layer 12 (or the portion 128) may partially cover the recess of the outer portion 39. The portion 128 may be blocked from covering the surface 11*p*1*s* of the first pad 11*p*1 prior to the formation of the first connection element 141. The portion 128 that climbs from the edge of the carrier 11 would not impact the connection of the first pad 1*p*1 and the first connection element 141. Therefore, the first connection element 141 and the first pad 11*p*1 may have a robust connection. The surface 11*p*1*s* of the first pad 11*p*1 is exposed by the protection layer 19, and the portion 128 does not extend into the area over the surface 11*p*1*s*. No additional remedies (e.g., laser etching or polishing) are required for the removal of the climbing portion 128. The location of the outer portion 39 may correspond to a trench 11*t*6. The trenches 11*t*5 and 11*t*6 may be defined in the same patterning process of forming the pads 11*p*. Thus, no additional patterning process (in other words, no additional mask) is required. Thus, the manufacturing cost can be kept low as compared to the additional remedies.

Figure 4A:
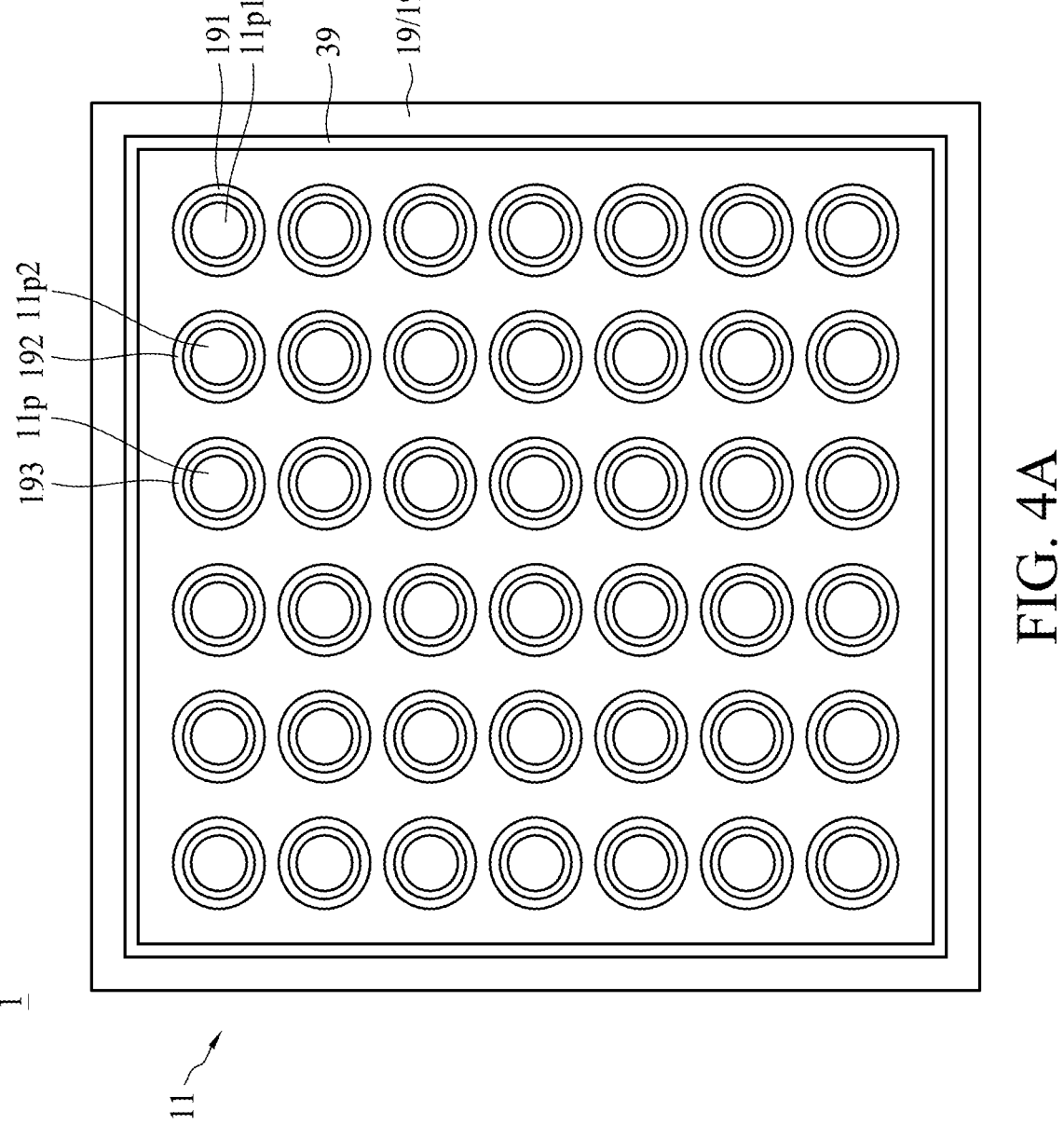
FIG. 4A is a top view of a carrier of an electronic device according to some embodiments of the present disclosure.

FIG. 4A is a top view of a carrier (e.g., the carrier 11) of an electronic device (e.g., the electronic device 1) according to some embodiments of the present disclosure. The carrier 11 of FIG. 4A is similar to the carrier 11 in FIG. 1B. Therefore, some detailed descriptions may refer to corresponding preceding paragraphs and are not repeated hereinafter for conciseness, with differences therebetween as follows.

As shown in FIG. 4A, the pads 11*p* (including the first pad 11*p*1, the second pad 11*p*2, and the third pad 11*p*3) may form an array. The array may be surrounded by an outer portion 39 of the protection layer 19. The outer portion 39 may be at the periphery region of the carrier 11. The blocking structure 191, the blocking structure 192, and the blocking structure 193, and the outer portion 39 may be configured to block the encapsulation layer 12 from covering the pads 11*p*. The details will be discussed in FIG. 4B.

Figure 4B:
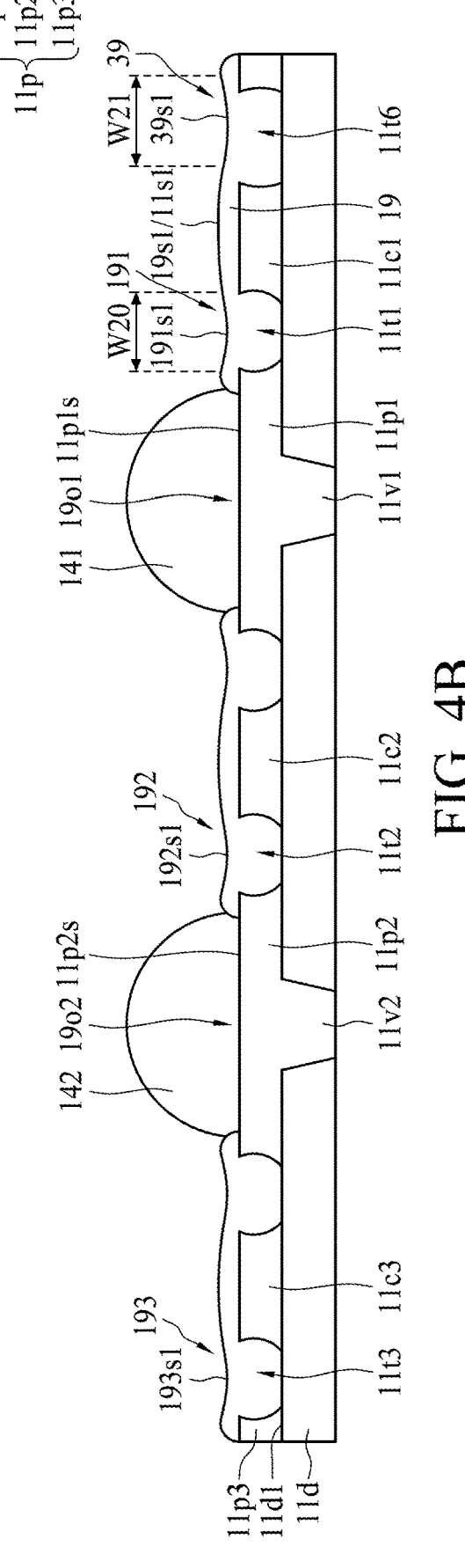
FIG. 4B is another enlarged cross-sectional view of a structure in a box B1 in FIG. 1.

FIG. 4B is another enlarged cross-sectional view of a structure in a box B1 in FIG. 1. The structure of FIG. 4B is similar to the structure in FIG. 1A. Therefore, some detailed descriptions may refer to corresponding preceding paragraphs and are not repeated hereinafter for conciseness, with differences therebetween as follows.

The outer portion 39 of the protection layer 19 may be at the periphery region of the carrier 11. The outer portion 39 may be closer to the lateral surface 11*s*3 than the first pad 11*p*1, and the blocking structures 191, 192, and 193. The outer portion 39 may include a recess. A width W20 of the blocking structure 191 may substantially equal a width W21 of the outer portion 39. The width W21 of the outer portion 39 may be around 100 µm.

The blocking structures 191, 192, and 193 and the outer portion 39 collaboratively block the climbing portions (e.g., 125 in FIG. 1D and 128 in FIG. 3C) of the encapsulation layer 12 from covering the pads 11*p*. The recesses of the blocking structure 191, the blocking structure 192, and the blocking structure 193, and the outer portion 39 can accommodate the climbing portions (e.g., 125 in FIG. 1D and 128 in FIG. 3C) of the encapsulation layer 12. The encapsulation layer 12 (or the climbing portion) may partially cover the recesses of the blocking structures 191, 192, and 193, and the outer portion 39. The climbing portions may be blocked from covering the surface (e.g., the surfaces 11*p*1*s*, 11*p*2*s*, and 11*p*3*s*) of the pads 11*p* prior to the formation of the connection elements 14. The climbing portions would not impact the connection of the pad 11*p* and the connection elements 14. Therefore, the connection elements 14 and the pads 11*p* may have a robust connection. The surfaces 11*p*1*s*, 11*p*2*s*, and 11*p*3*s* of the pads 11*p* are exposed by the protection layer 19, and the climbing portion does not extend into the area over the surfaces 11*p* is, 11*p*2*s*, and 11*p*3*s*. No additional remedies (e.g., laser etching or polishing) are required for the removal of the climbing portions. The location of the blocking structures 191, 192, and 193 respectively correspond to the trenches 11*t*1, 11*t*2, and 11*t*3. The trenches 11*t*1, 11*t*2, 11*t*3, and 11*t*6 may be defined in the same patterning process of forming the pads 11*p*. Thus, no additional patterning process (in other words, no additional mask) is required. Thus, the manufacturing cost can be kept low.

Figure 4C:
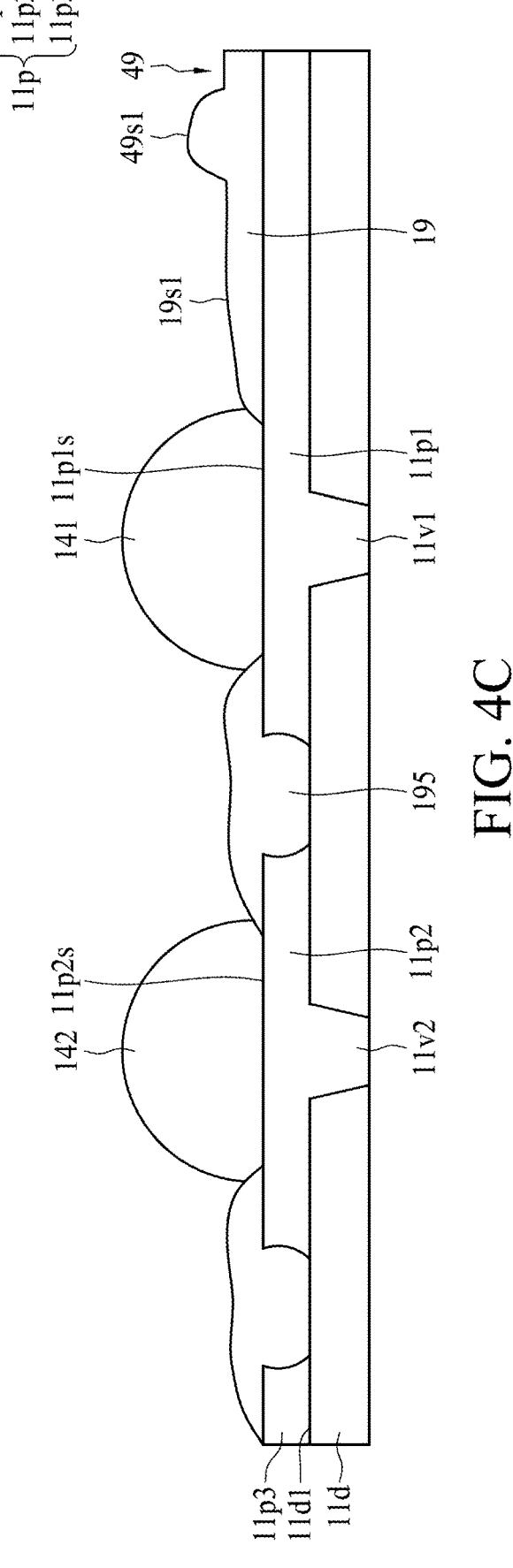
FIG. 4C is another enlarged cross-sectional view of a structure in a box B1 in FIG. 1.

FIG. 4C is another enlarged cross-sectional view of a structure in a box B1 in FIG. 1. The structure of FIG. 4C is similar to the structure in FIG. 1A. Therefore, some detailed descriptions may refer to corresponding preceding paragraphs and are not repeated hereinafter for conciseness, with differences therebetween as follows.

The protection layer 19 may include an outer portion 49, rather than the portions 191, 192, and 193. The outer portion 49 may be at the periphery region of the carrier 11. The outer portion 49 may be closer to the lateral surface 11*s*3 than the first pad 11*p*1. The outer portion 49 may surround the array of the pads 11*p*. The outer portion 49 may protrude from the surface 19*s*1 of the protection layer 19. The outer portion 49 may include a wall. The outer portion 49 may be configured to block the encapsulation layer 12 from covering the pads 11*p*. The outer portion 49 may barricade the encapsulation layer 12 (e.g., the climbing portion), such that the possibility of the encapsulation layer 12 arriving at the pads 11*p* is lessened.

The first pad 11*p*1, the second pad 11*p*2, and the third pad 11*p*3 may be spaced apart from a portion 195 of the protection layer 19. The location of the portion 195 may correspond to a trench 11t5. The trench 11t5 may be defined in the patterning process of the first pad 11p1, the second pad 11p2, and the third pad 11p3. The portion 195 disposed within the trench 11t5 is for isolating the first pad 11p1, the second pad 11p2, and the third pad 11p3.

Figure 4D:
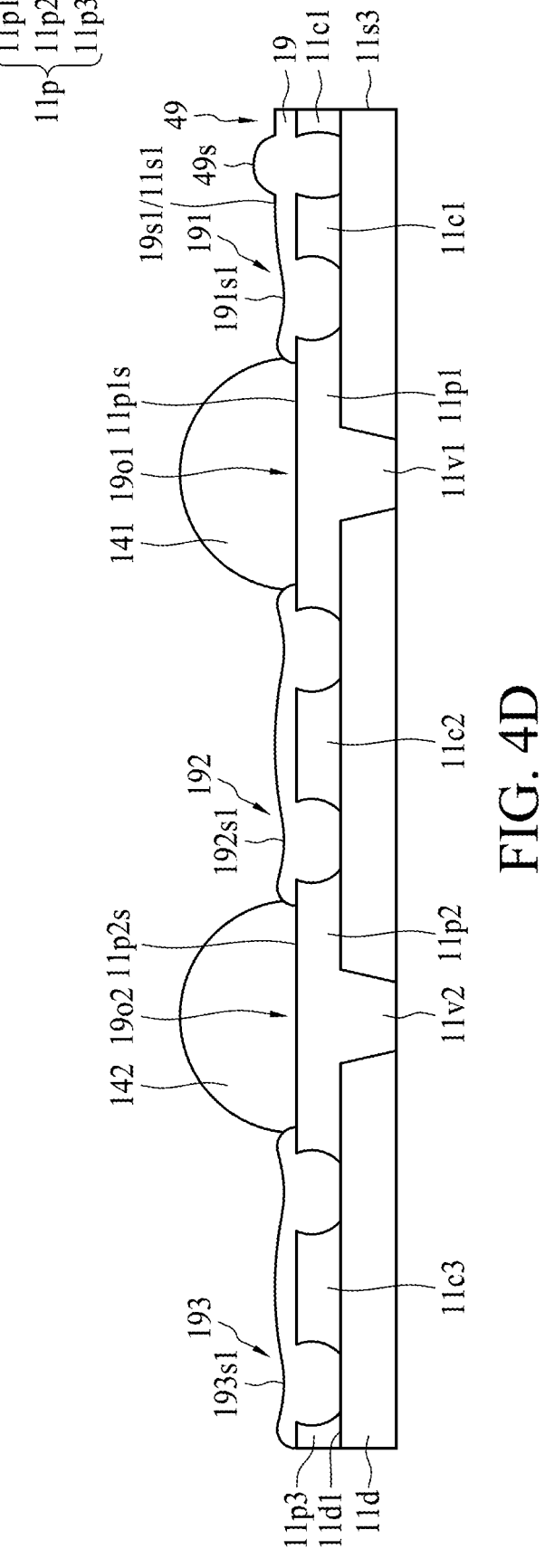
FIG. 4D is another enlarged cross-sectional view of a structure in a box B1 in FIG. 1.

FIG. 4D is another enlarged cross-sectional view of a structure in a box B1 in FIG. 1. The structure of FIG. 4D is similar to the structure in FIG. 1A. Therefore, some detailed descriptions may refer to corresponding preceding paragraphs and are not repeated hereinafter for conciseness, with differences therebetween as follows.

The protection layer 19 may further include the outer portion 49 which is similar or identical to that in FIG. 4C.

The blocking structures 191, 192, and 193 and the outer portion 49 collaboratively block the climbing portions (e.g., 125 in FIG. 1D and 128 in FIG. 3C) of the encapsulation layer 12 from covering the pads 11p. The recesses of the blocking structures 191, 192, and 193 can accommodate the climbing portions (e.g., 125 in FIG. 1D) the encapsulation layer 12. The encapsulation layer 12 (or the climbing portion) may partially cover the recess of the blocking structures 191, 192, and 193. The outer portion 49 may barricade the encapsulation layer 12 (e.g., the climbing portion). The climbing portions may be blocked from covering the surface (e.g., the surfaces 11p is, 11p2s, and 11p3s) of the pads 11p prior to the formation of the connection elements 14. The climbing portions would not impact the connection of the pad 11p and the connection elements 14. Therefore, the connection elements 14 and the pads 11p may have a robust connection. The surfaces 11p1s, 11p2s, and 11p3s of the pads 11p are exposed by the protection layer 19, and the climbing portion does not extend into the area over the surfaces 11p1s, 11p2s, and 11p3s. No additional remedies (e.g., laser etching or polishing) are required for the removal of the climbing portions.

Figure 5:
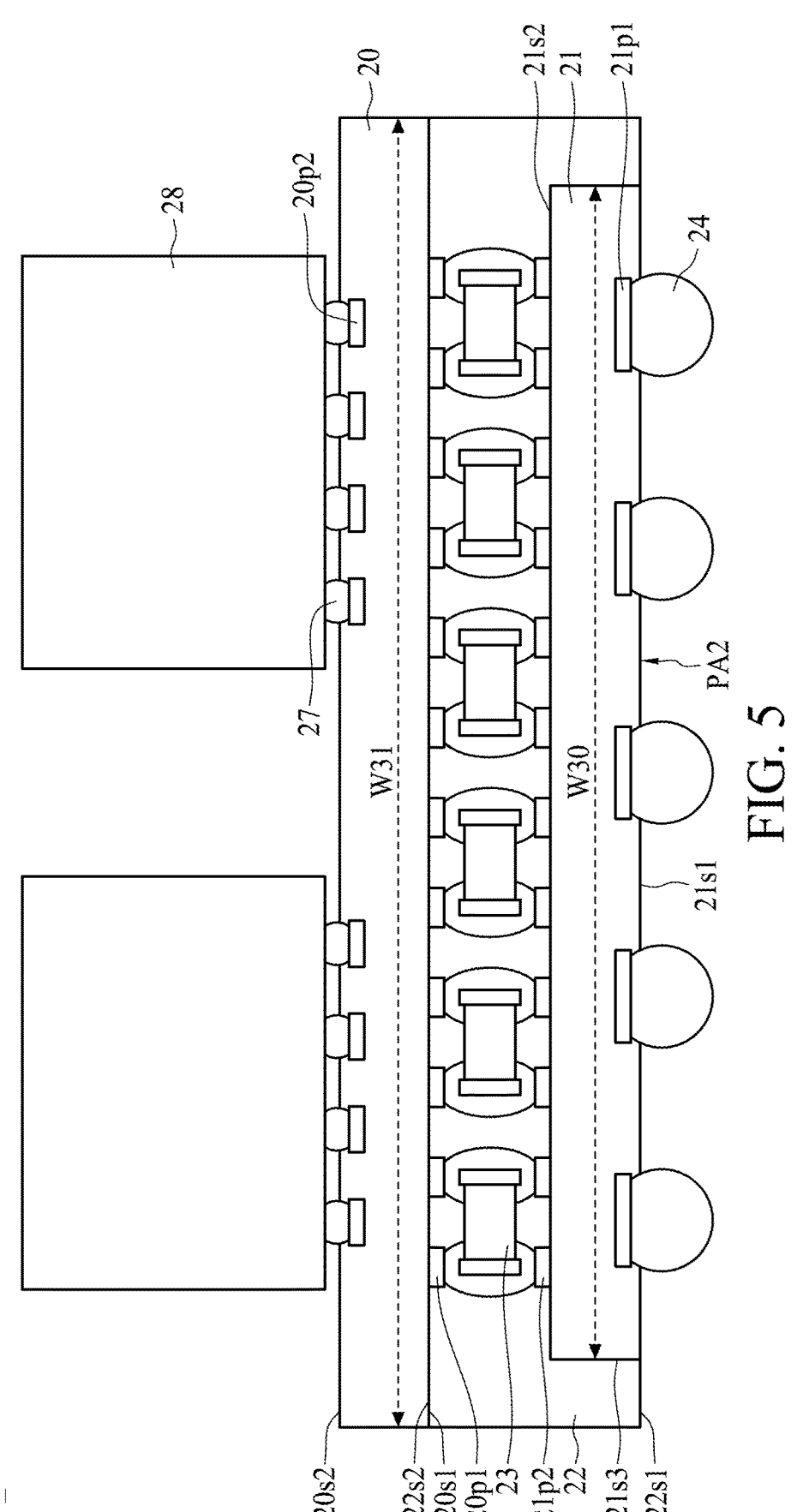
FIG. 5 is a cross-sectional view of an electronic device according to some embodiments of the present disclosure.

FIG. 5 is a cross-sectional view of an electronic device 5 according to some embodiments of the present disclosure. The electronic device 5 may include a carrier 20, a carrier 21, an encapsulation layer 22, one or more electronic components 23, a plurality of connection elements 24, a plurality of connection elements 27, and one or more electronic components 28.

The carrier (or a circuit structure, a substrate) 20 may have a first surface 20s1 and a second surface 20s2 opposite to the first surface 20s1. The first surface 20s1 may face the carrier 11 and the encapsulation layer 12. The second surface 20s2 may face away from the carrier 11 and the encapsulation layer 12. The carrier 20 may be or include, for example, one or more of a printed circuit board, such as a paper-based copper foil laminate, a composite copper foil laminate, a polymer-impregnated glass-fiber-based copper foil laminate, and so on. The carrier 20 may include a dielectric layer and an interconnection structure, such as a redistribution layer (RDL) and/or a grounding element. The interconnection layer may be covered or encapsulated by the dielectric layer. The carrier 20 may include a plurality of pads 20p2 at the first surface 20s1. The carrier 20 may include a plurality of pads 20p2 at the second surface 20s2.

The one or more electronic components 28 may be mounted to the second surface 20s2 of the carrier 20 through the plurality of connection elements 27. The one or more electronic components 28 may be electrically connected to the carrier 20 through the pads 20p2. The one or more electronic components 28 may be electrically connected to the carrier 21 through the carrier 20. The electronic component 28 may be supported by the carrier 20.

In some embodiments, the electronic component 28 may include, for example, a central processing unit (CPU), a microprocessor unit (MPU), a graphics processing unit (GPU), a microcontroller unit (MCU), an application-specific integrated circuit (ASIC), a field-programmable gate array (FPGA), or another type of integrated circuit. In some embodiments, the electronic component 28 may include one or more processing elements and one or more memory elements electrically connected to the processing elements. The processing element(s) and the memory element(s) may be divided from or originate in a monolithic processing unit (e.g., a CPU, a MPU, a GPU, a MCU, an ASIC, or the like). In some embodiments, the processing element may be a CPU chiplet, a MCU chiplet, a GPU chiplet, an ASIC chiplet, or the like. The memory element may be a cache memory.

The connection elements 27 may be disposed over the carrier 20. The connection elements 27 may be electrically connected to carrier 20. The connection elements 27 may include solder balls, controlled collapse chip connection (C4) bumps, a ball grid array (BGA), or a land grid array (LGA).

The carrier (or a circuit structure, a substrate) 21 may have a first surface 21s1 and a second surface 21s2 opposite to the first surface 21s1. The first surface 21s1 may face away from the carrier 21 and the encapsulation layer 22. The second surface 20s2 may face the carrier 20 and the encapsulation layer 22. The carrier 21 may be or include, for example, one or more of a printed circuit board, such as a paper-based copper foil laminate, a composite copper foil laminate, a polymer-impregnated glass-fiber-based copper foil laminate, and so on. The carrier 21 may include a dielectric layer and an interconnection structure, such as a redistribution layer (RDL) and/or a grounding element. The interconnection layer may be covered or encapsulated by the dielectric layer.

The carrier 21 may have a lateral surface 21s3 extending between the first surface 21s1 and the second surface 21s2. The lateral surface 21s3 may be covered by the encapsulation layer 12. The second surface 21s2 may be covered by the encapsulation layer 22 and the first surface 21s1 may be exposed by the encapsulation layer 22.

The carrier 21 may have a width W30 and the carrier 20 may have a width W31. The width W30 is smaller than the width W31. The carrier 21 may be referred to as a sub-carrier and the carrier 20 may be referred to as a mother board. The carrier 21 may be mounted to the carrier 20, followed by the application of the encapsulation layer 22. In some embodiments, a density of a circuit line (including, for example, a trace or a pad) of the carrier 21 is greater than a density of a circuit line of the carrier 20.

The one or more electronic components 23 may be mounted to the carrier 21. The one or more electronic components 23 may be electrically connected to the carrier 21 through a plurality of pads 21p2 at the second surface 21s2 of the carrier 21. The one or more electronic components 23 may be supported by the carrier 21. The one or more electronic components 23 may be disposed over the carrier 21. The one or more electronic components 23 may be covered or encapsulated by the encapsulation layer 22.

The one or more electronic components 23 may be mounted to the carrier 20. The one or more electronic components 23 may be disposed between the carrier 20 and the carrier 21. The one or more electronic components 23 may be electrically connected to the carrier 20 through the pads 20p1 at the first surface 20s1 of the carrier 20. The carrier 20 may be electrically connected to the carrier 21 through the one or more electronic components 23.

The electronic component 23 may be electrically connected to the carrier 21 through SMT. The electronic component 23 may be electrically connected to the carrier 20 through SMT. The electronic component 23 may be or include an SMD. The electronic component 23 may be or include a passive device, e.g., a capacitor, a resistor, an inductor, a diode, or the like. The electronic component 23 may be or include an active device, e.g., a transistor.

The encapsulation layer 22 may have a first surface 22s1 and a second surface 22s2 opposite to the first surface 22s1. The first surface 22s1 may be substantially coplanar to the first surface 21s1 of the carrier 21. In some embodiments, the first surface 22s1 may be further away from the second surface 21s2 of the carrier 21 than the first surface 21s1 of the carrier 21. The second surface 22s2 may be in contact with the first surface 20s1 of the carrier 20. The encapsulation layer 22 may include an epoxy resin including fillers, a molding compound (e.g., an epoxy molding compound or other molding compound), polyimide, a phenolic compound or material, a material including silicone dispersed therein, or a combination thereof. The encapsulation layer 22 may be electrically insulative.

The carrier 21 may have a predetermined region PA2. The predetermined region PA2 may be configured to connect an external device (not shown) other than the electronic device 2. The carrier 21 may include a plurality of pads (or conductive pads) 21p1 at the first surface 21s1. The plurality of pads 21p1 may be disposed in the predetermined region PA2. The predetermined region PA2 may include the first surface 21s1. The connection elements 24 may be disposed on the pads 21p1. The connection elements 24 may be disposed on the predetermined region PA2. The pads 21p1 may be made of metal, such as copper, gold, silver, aluminum, titanium, tantalum, or the like. The connection elements 24 may be configured to connect an external device (not shown) other than the electronic device 2. The connection elements 24 may be electrically connected to carrier 21 through the pads 21p1. The connection elements 24 are mounted to the carrier 21. The connection elements 24 may include solder balls, controlled collapse chip connection (C4) bumps, a ball grid array (BGA), or a land grid array (LGA).

The encapsulation layer 22 may have a portion which may climb on the first surface 21s1 of the carrier 21. In some cases, the climbing portion of the encapsulation layer 22 may fully or partially cover one or more of the pads 21p prior to the formation of the connection elements 24. In some cases, this would hinder the connection between the pads 21p and the connection elements 24. In some cases, the insulative climbing portion obscures the electrical connection between the pads 21p and the connection elements 24.

The present disclosure provides the electronic device 5 including a structure at the first surface 21s1 of the carrier 21 and around the pads 21p1 to block the encapsulation layer 22 (or the climbing portion) from covering the pads 21p1. The structure as herein discussed is similar or substantially identical to at least one of the structures in FIG. 1A, FIG. 1B, FIG. 1C, FIG. 1D, FIG. 1E, FIG. 1F, FIG. 1G, FIG. 1H, FIG. 1I, FIG. 1J, FIG. 2A, FIG. 2B, FIG. 2C, FIG. 2D, FIG. 3A, FIG. 3B, FIG. 3C, FIG. 4A, FIG. 4B, FIG. 4C, and FIG. 4D. Therefore, some detailed descriptions may refer to corresponding preceding paragraphs and are not repeated hereinafter for conciseness, with differences therebetween as follows. The electronic device 5 may provide at least a similar or identical technical effect to that of the electronic device 1.

FIG. 6A, 6B, 6C, 6D, 6D-1, or 6E illustrates one or more stages of an example of a method for manufacturing an electronic device according to some embodiments of the present disclosure.

Figure 6A:
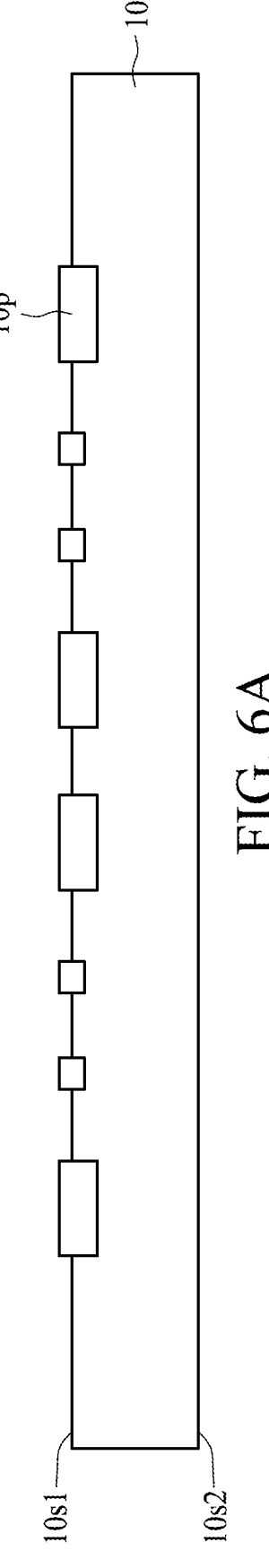

As shown in FIG. 6A, a carrier 10 may be provided. The carrier 10 may have a first surface 10s1 and a second surface 10s2 opposite to the first surface 10s1. The carrier 10 may include a plurality of pads 10p at the first surface 10s1.

Figure 6B:
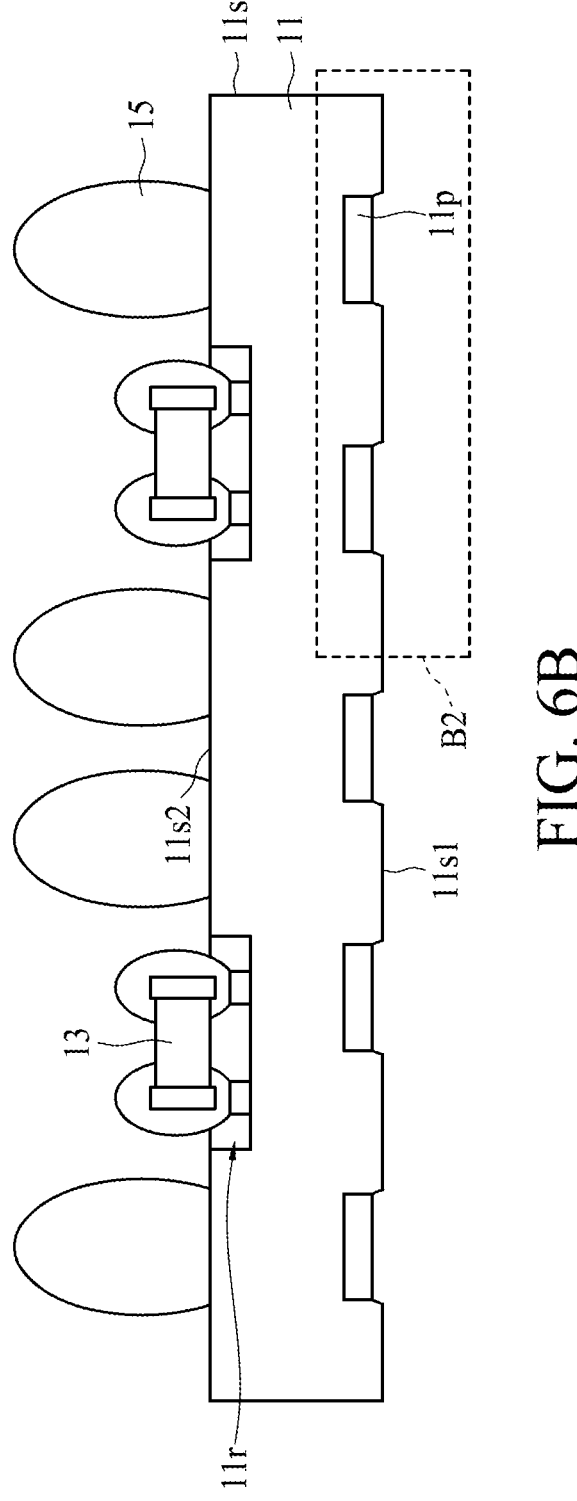
Figures 1, 6B:
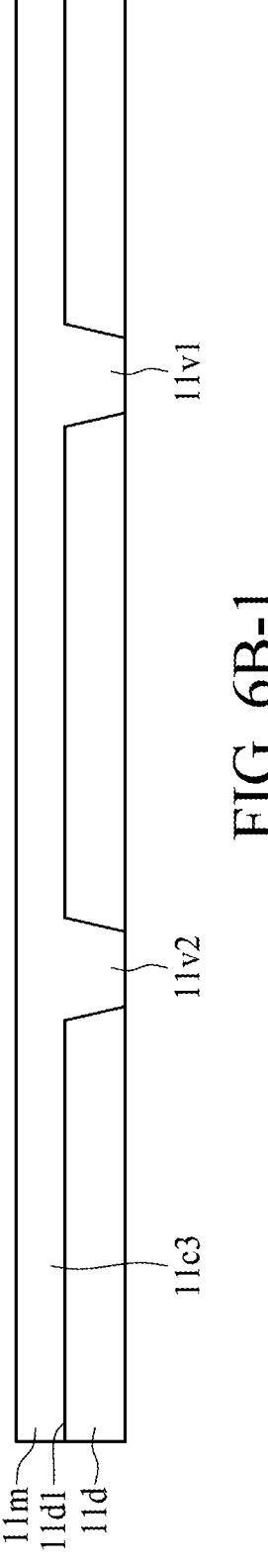

As shown in FIG. 6B, a carrier 11 may be provided. The carrier 11 may have a first surface 11s1 and a second surface 11s2 opposite to the first surface 11s1. One or more electronic components 13 may be mounted to the second surface 11s2 through a plurality of pads at the second surface 11s2. A plurality of connection elements 15 may be formed on the second surface 11s2. The connection elements 15 may include solder balls, controlled collapse chip connection (C4) bumps, a ball grid array (BGA), or a land grid array (LGA). After the formation of the connection elements 15, a thermal (reflow) process and/or cleaning (de-flux) process may be applied to the carrier 11.

The carrier 11 may include a plurality of pads 11p at the first surface 11s1. The manufacture of a structure at the first surface 11s1 of the carrier 11 and around the pads 11p for blocking an encapsulation layer from covering the pads 11p will be discussed in FIG. 6B-1, 6B-2, 6B-3, or 6B-4.

FIG. 6B-1, 6B-2, 6B-3, or 6B-4 illustrates one or more stages of manufacturing a structure in a box B2 of FIG. 6B according to some embodiments of the present disclosure.

As shown in FIG. 6B-1, the carrier 11 may include a dielectric layer 11d having a surface 11d1. A first via 11v1, and a second via 11v2 may be formed within the dielectric layer 11d. A conductive material 11m may be formed over the surface 11d1 of the dielectric layer 11d. There may be no boundary/interface between the first via 11v1/the second via 11v2 and the conductive material 11m. The conductive material 11m may be made of metal, such as copper, gold, silver, aluminum, titanium, tantalum, or the like. The first via 11v1 and the second via 11v2 may be made of metal, such as copper, gold, silver, aluminum, titanium, tantalum, or the like.

Figures 2, 6B:
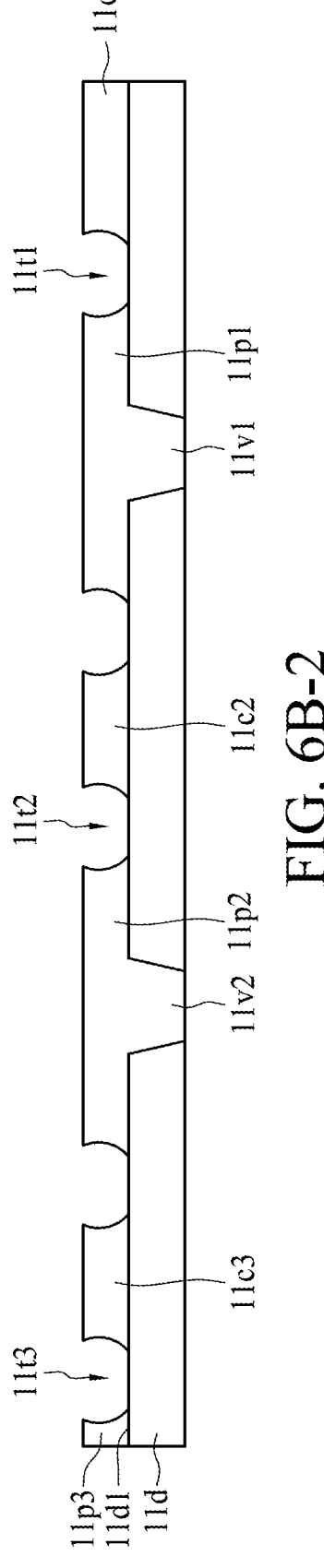

As shown in FIG. 6B-2, the conductive material 11m may be patterned and etched to form a plurality of pads 11p, at least including a first pad 11p1, a second pad 11p2, and a third pad 11p3. The first pad 11p1 is closer to the lateral surface 11s3 than the second pad 11p2 and the third pad 11p3. The conductive material 11m may be patterned and etched to form a first conductive layer 11d1, a second conductive layer 11c2, and a third conductive layer 11c3. A trench 11t1 may surround the first pad 11p1; a trench 11t2 may surround the second pad 11p2; and a trench 11t3 may surround the third pad 11p3. The trenches 11t1, 11t2, and 11t3 may have a tapered shape. The trench 11t2 (or a part) and the trench 11t3 (or a part) may be disposed between the second pad 11p2 and the third pad 11p3 in a cross-sectional view.

The first pad 11p1 may be connected to the first via 11v1; the second pad 11p2 may be connected to the second via 11v2; and the third pad 11p3 may be connected to a via (not shown). The first conductive layer 11c1, the second conductive layer 11c2, and the third conductive layer 11c3 may be referred to as electrically grounding layers.

Figures 3, 6B:
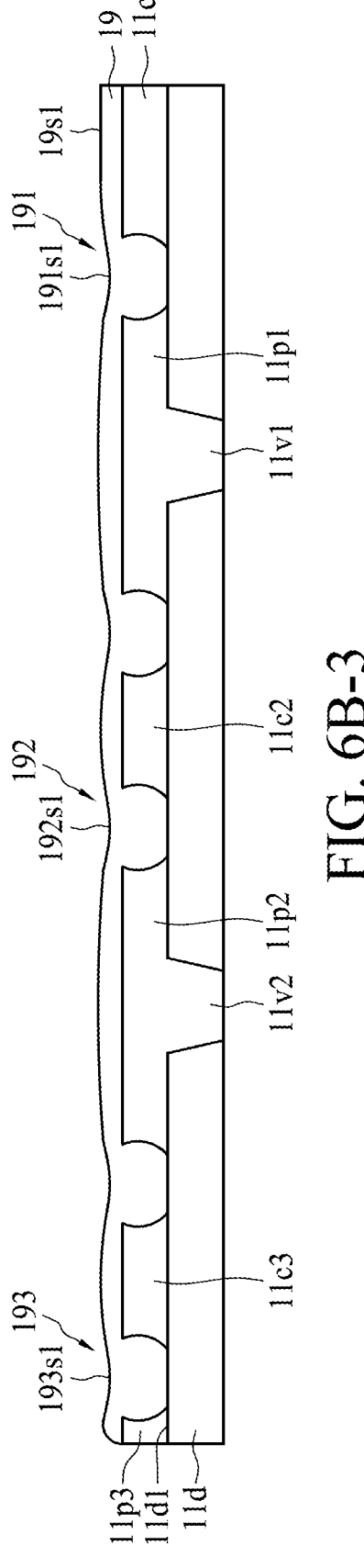

As shown in FIG. 6B-3, a protection layer 19 may be formed over the first pad 11p1, the second pad 11p2, and the third pad 11p3. The protection layer 19 may be formed within the trench 11*t*1, the trench 11*t*2, and the trench 11*t*3. The protection layer 19 may include a solder mask. The protection layer 19 may include a blocking structure 191, a blocking structure 192, and a blocking structure 193 respectively over the trenches 11*t*1, 11*t*2, and 11*t*3. The blocking structure 191, the blocking structure 192, and the blocking structure 193 may each have a recess. The blocking structure 191 may have a curved surface 191*s*1; the blocking structure 192 may have a curved surface 192*s*1; and the blocking structure 193 may have a curved surface 193*s*1. In some embodiments, the blocking structures 191, 192, and 193 may each have a ring recess in a top view.

Figures 4, 6B:
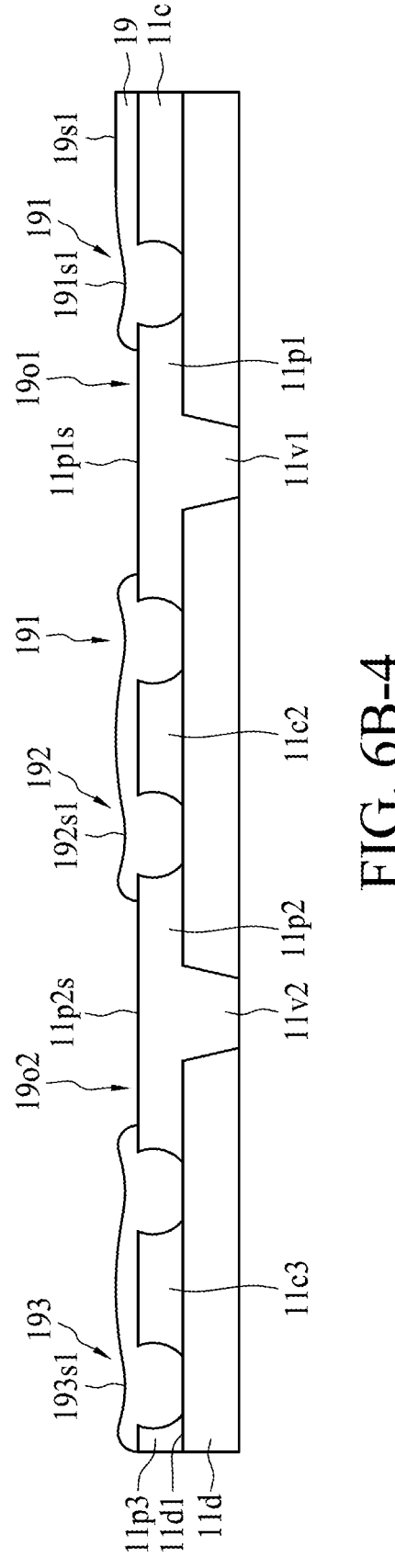

As shown in FIG. 6B-4, the protection layer 19 may be patterned and etched to form openings 19*o*1 and 19*o*2 and define an exposed surface 11*p*1*s* of the first pad 11*p*1 and an exposed surface 11*p*2*s* of the second pad 11*p*2. The exposed surface 11*p*1*s* may be spaced apart from the blocking structure 191. The exposed surface 11*p*2*s* may be spaced apart from the blocking structure 192. The blocking structure 191, the blocking structure 192, and the blocking structure 193 may be configured to block an encapsulation layer from covering the exposed surface 11*p*1*s* and the exposed surface 11*p*2*s*. As such, no encapsulation layer would extend into the area over the exposed surface 11*p*1*s* and the exposed surface 11*p*2*s*. After the stages in FIG. 6C, FIG. 6D, FIG. 6D-1, and FIG. 6E, a plurality of connection elements (e.g., 141 and 142 in FIG. 1A) will be formed on the exposed surface 11*p*1*s* and the exposed surface 11*p*2*s* to form the structure in FIG. 1A.

Since no encapsulation layer appears on the exposed surface 11*p*1*s* and the exposed surface 11*p*2*s* (or in the openings 19*o*1 and 19*o*2), the connection between the pads 11*p* and the connection elements will be robust. No additional remedies (e.g., laser etching or polishing) are required for the removal of the encapsulation layer on the area over the exposed surface 11*p*1*s* and the exposed surface 11*p*2*s*.

Figure 6C:
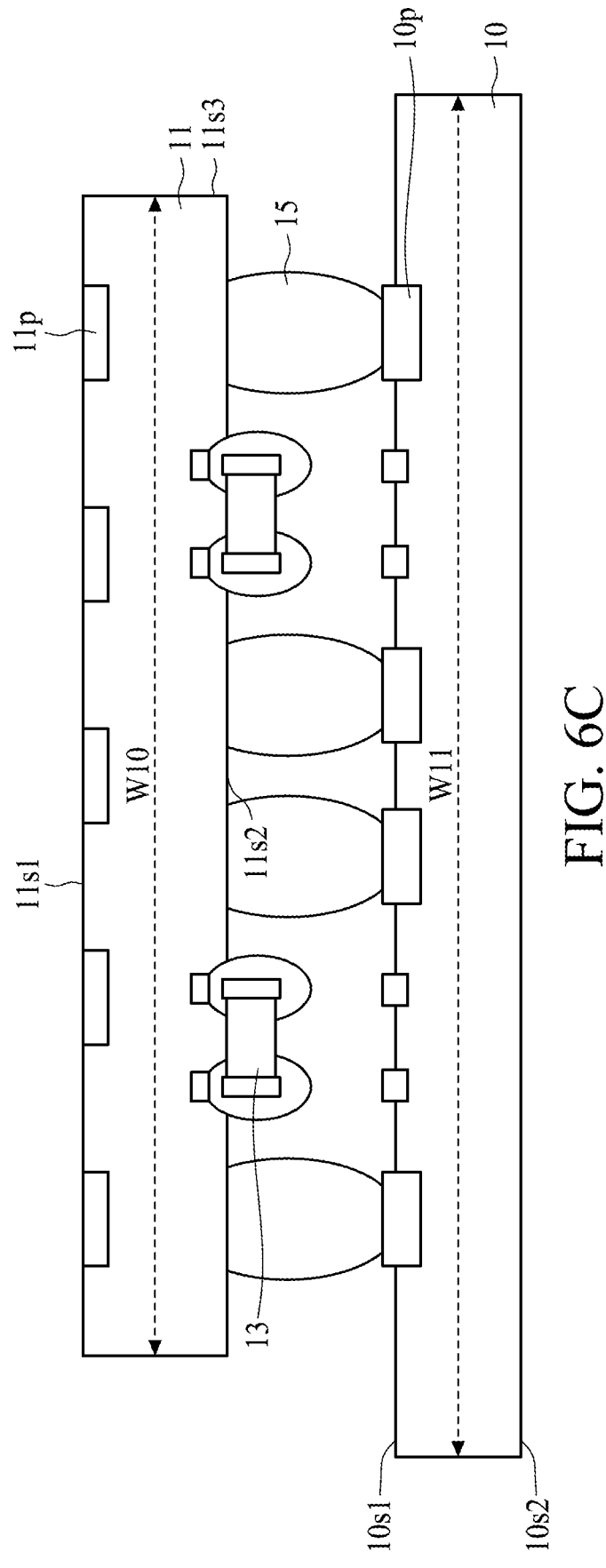

As shown in FIG. 6C, the carrier 11 may be mounted to the carrier 10 through the plurality of connection elements 15. There may be a plurality of carriers mounted to the carrier 10. These carriers and the carrier 11 may have different heights and thus their upper surfaces that face away from the carrier 10 may be at different elevations. Some detailed descriptions may refer to preceding paragraphs relevant to FIG. 8A.

Figure 6D:
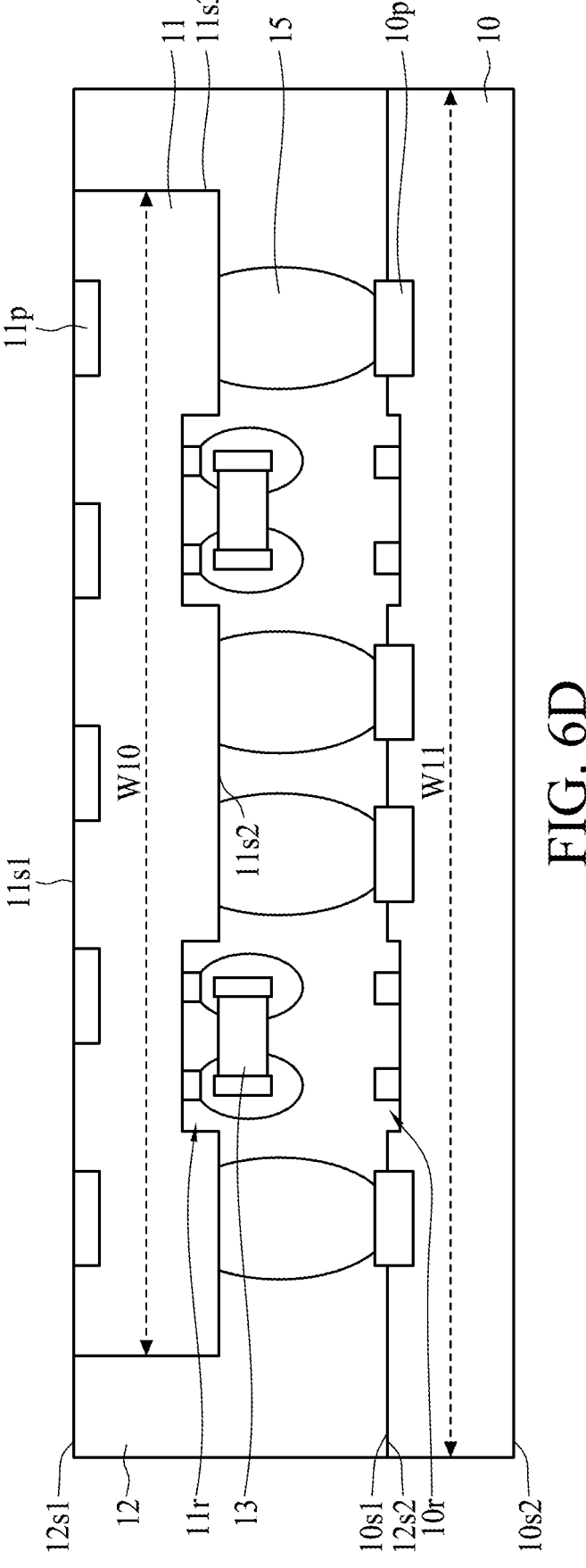
Figures 1, 6D:
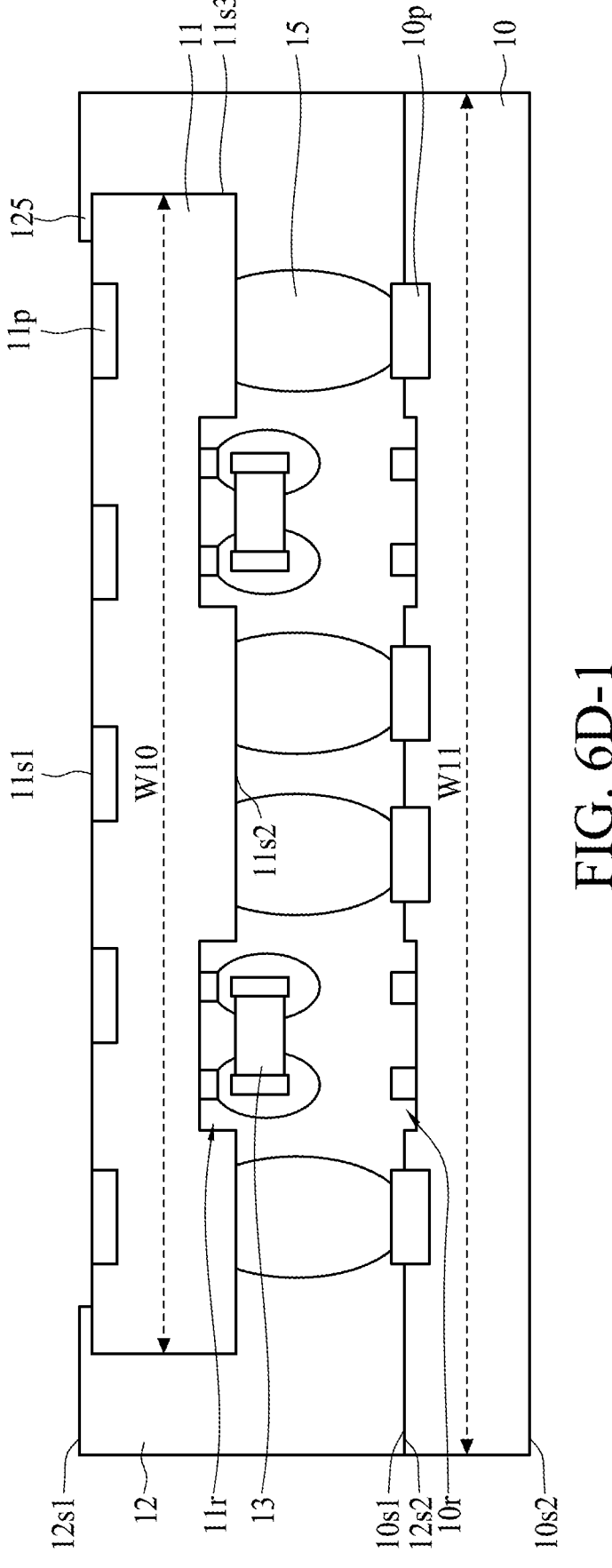

As shown in FIG. 6D, an encapsulation layer 12 may be applied to the space between the carrier 10 and the carrier 11. The encapsulation layer 12 may cover or encapsulate the first surface 10*s*1 of the carrier 10, the second surface 11*s*2 of the carrier 11, the one or more electronic components 13, and the connection elements 15. The encapsulation layer 12 may cover or encapsulate a lateral surface 11*s*3 of the carrier 11.

As shown in FIG. 6D-1, an excessive portion of the encapsulation layer 12 may climb from the lateral surface 11*s*3 to the first surface 11*s*1 of the carrier 11. A climbing portion 125 of the encapsulation layer 12 may flow over the first surface 11*s*1 of the carrier 11. The blocking structures 191, 192, and 193 of the structure in FIG. 6B-4 are configured to block the climbing portion 125 of the encapsulation layer 12. The recess of the blocking structures 191, 192, and 193 may accommodate the climbing portion 125 of the encapsulation layer 12. The climbing portion 125 may be spaced apart from the pads 11*p*. Hence, no climbing portion (or excessive portion) of the encapsulation layer 12 extends onto the exposed surfaces 11*p*1*s* and 11*p*2*s* of the pads 11*p*.

Furthermore, the carrier 10 and the encapsulation layer 12 may be singulated to form a package unit.

Figure 6E:
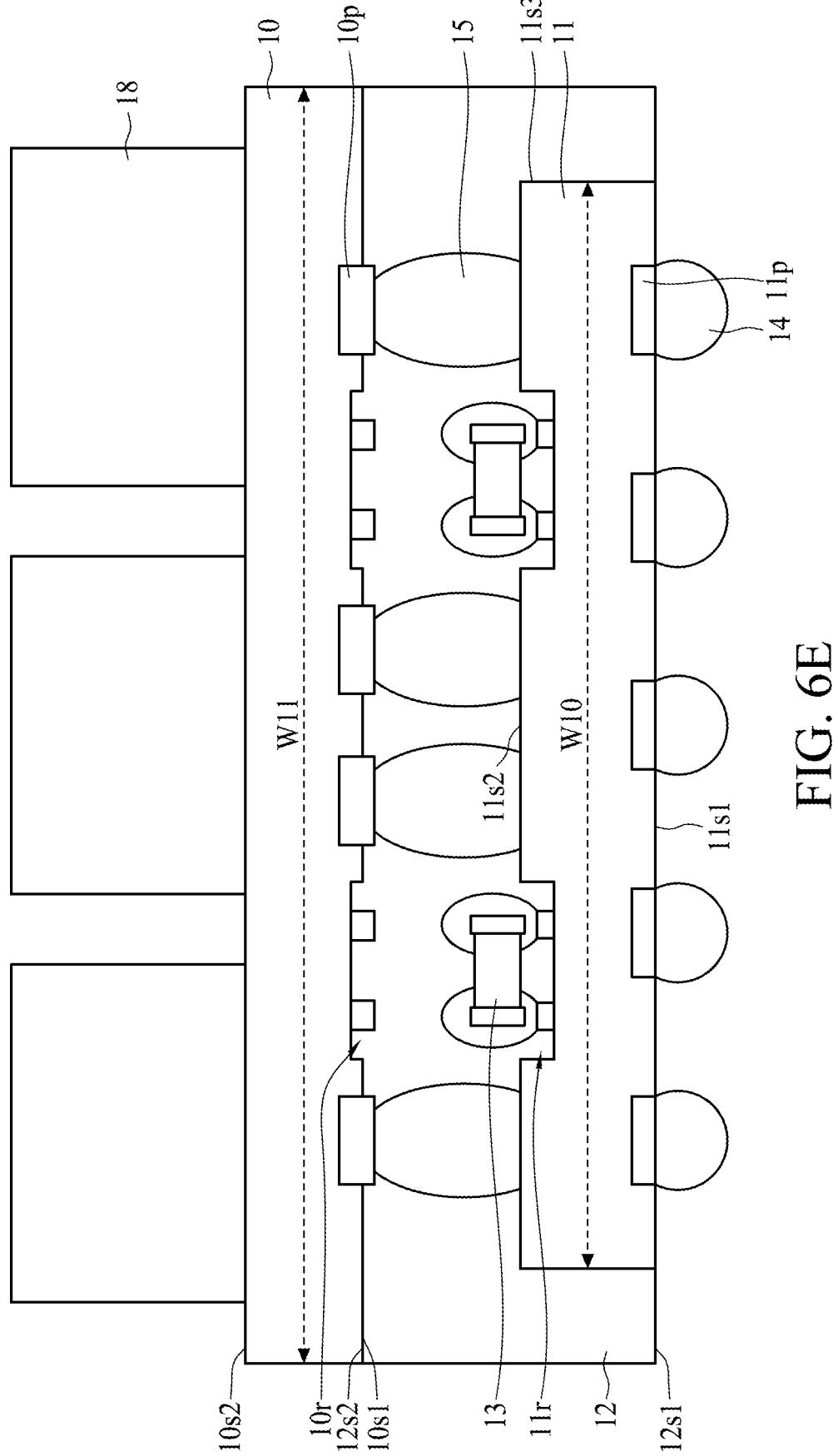

As shown in FIG. 6E, one or more electronic components 18 may be mounted to the second surface 10*s*2 of the carrier 10. Afterwards, a plurality of connection elements 14 may be formed on the pads 11*p* of the carrier 11 to form an electronic device 1 as shown in FIG. 1.

FIG. 7A, 7B, 7C, 7D, or 7E illustrates one or more stages of an example of a method for manufacturing an electronic device according to some embodiments of the present disclosure.

Figure 7A:
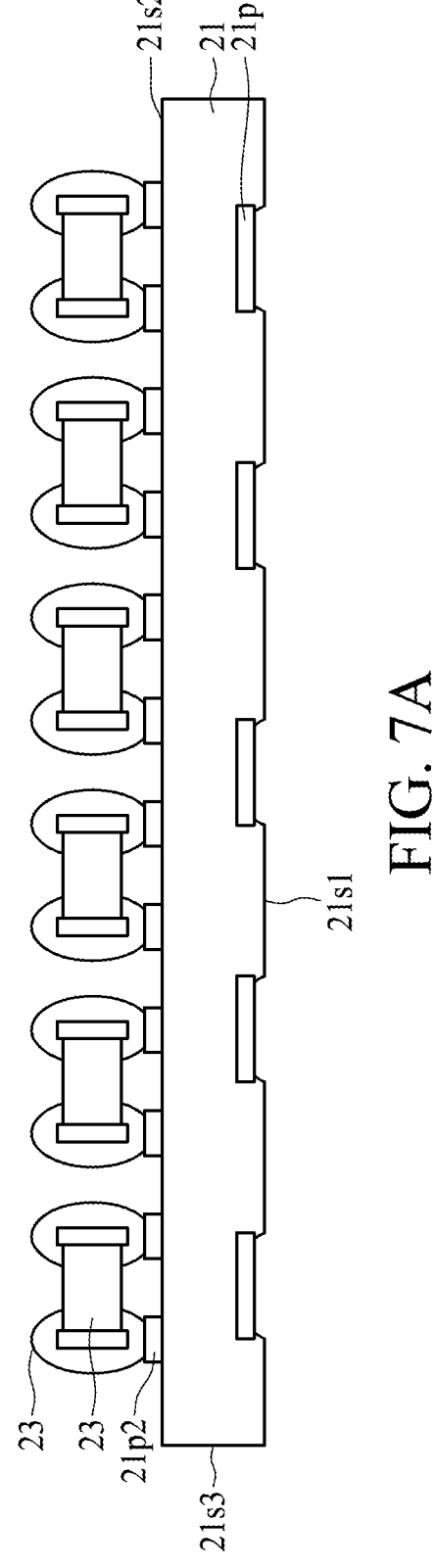
FIG. 7A, 7B, 7C, 7D, or 7E illustrates one or more stages of an example of a method for manufacturing an electronic device according to some embodiments of the present disclosure.

As shown in FIG. 7A, a carrier 21 may be provided. The carrier 21 may have a first surface 21*s*1 and a second surface 21*s*2 opposite to the first surface 21*s*1. One or more electronic components 23 may be mounted to the second surface 21*s*2 through a plurality of pads 21*p*2 at the second surface 11*s*2. After the mounting of the one or more electronic components 23 to the carrier 21, a thermal (reflow) process and/or cleaning (de-flux) process may be applied.

The carrier 21 may include a plurality of pads 21*p*1 at the first surface 21*s*1. The manufacture of a structure at the first surface 21*s*1 of the carrier 21 and around the pads 21*p*1 for blocking an encapsulation layer (or the climbing portion) from covering the pads 21*p*1 is similar or identical to the structure as discussed in FIG. 6B-1, 6B-2, 6B-3, or 6B-4.

Figure 7B:
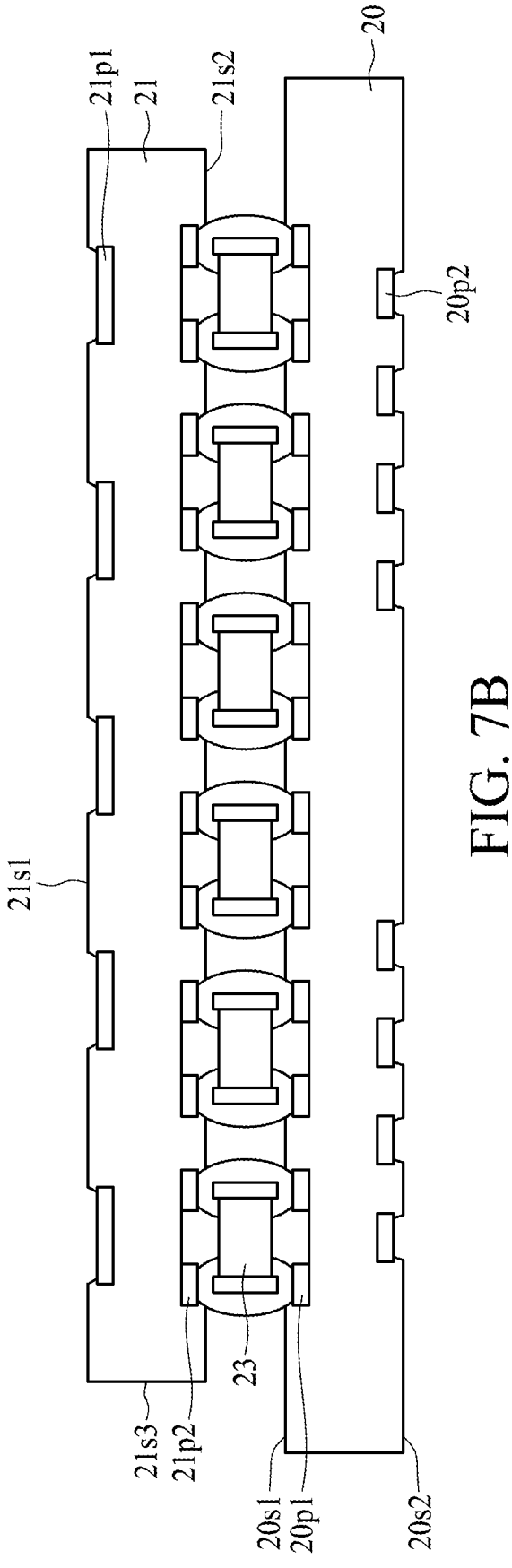

As shown in FIG. 7B, the carrier 21 may be mounted to the carrier 20 through the one or more electronic components 23. There may be a plurality of carriers mounted to the carrier 20. These carriers and the carrier 21 may have different heights and thus their upper surfaces that face away from the carrier 20 may be at different elevations. Some detailed descriptions may refer to preceding paragraphs relevant to FIG. 8A. After the mounting of the one or more electronic components 23 to the carrier 20, a thermal (reflow) process and/or cleaning (de-flux) process may be applied.

Figure 7C:
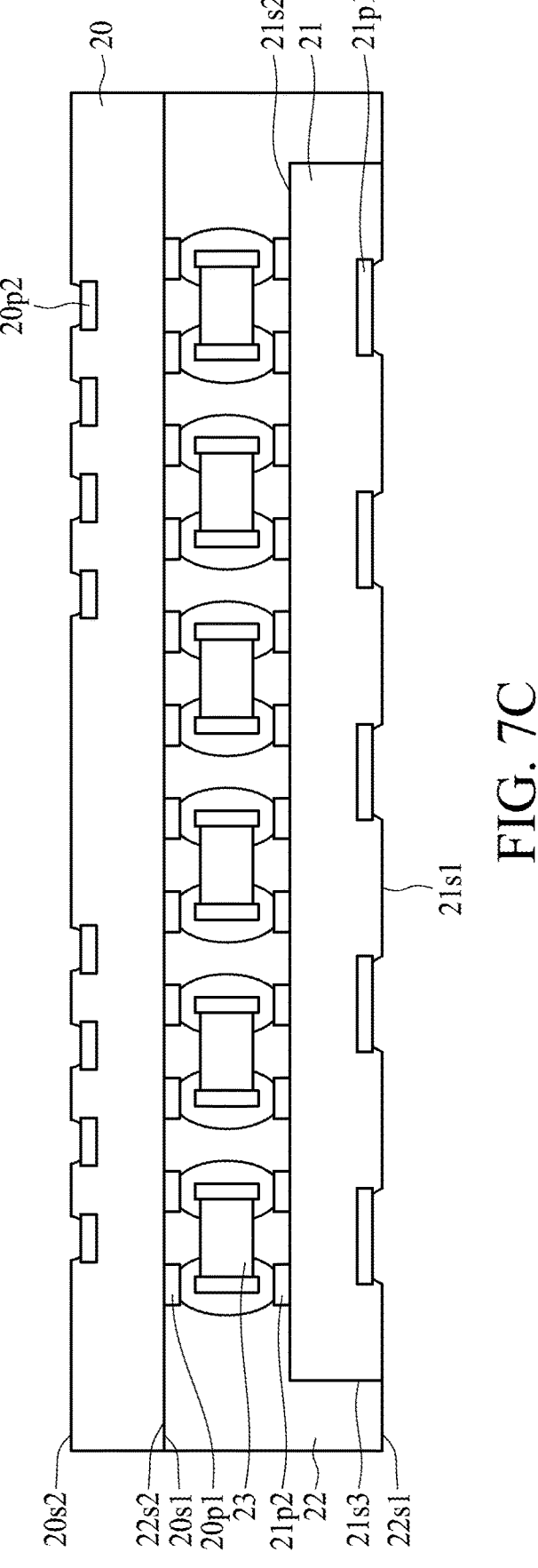

As shown in FIG. 7C, an encapsulation layer 22 may be applied to the space between the carrier 20 and the carrier 21. The encapsulation layer 22 may cover or encapsulate the first surface 20*s*1 of the carrier 20, the second surface 21*s*2 of the carrier 21, and the one or more electronic components 23. The encapsulation layer 22 may cover or encapsulate a lateral surface 21*s*3 of the carrier 21. An excessive portion of the encapsulation layer 22 may climb from the lateral surface 21*s*3 to the first surface 21*s*1 of the carrier 21. The blocking structures at the first surface 21*s*1 of the carrier 21 and around the pads 21*p*1 can block the encapsulation layer 22 (or the climbing portion) from covering the pads 21*p*1. Hence, no climbing portion (or excessive portion) of the encapsulation layer 22 extend onto the exposed surfaces of the pads 21*p*.

Figure 7D:
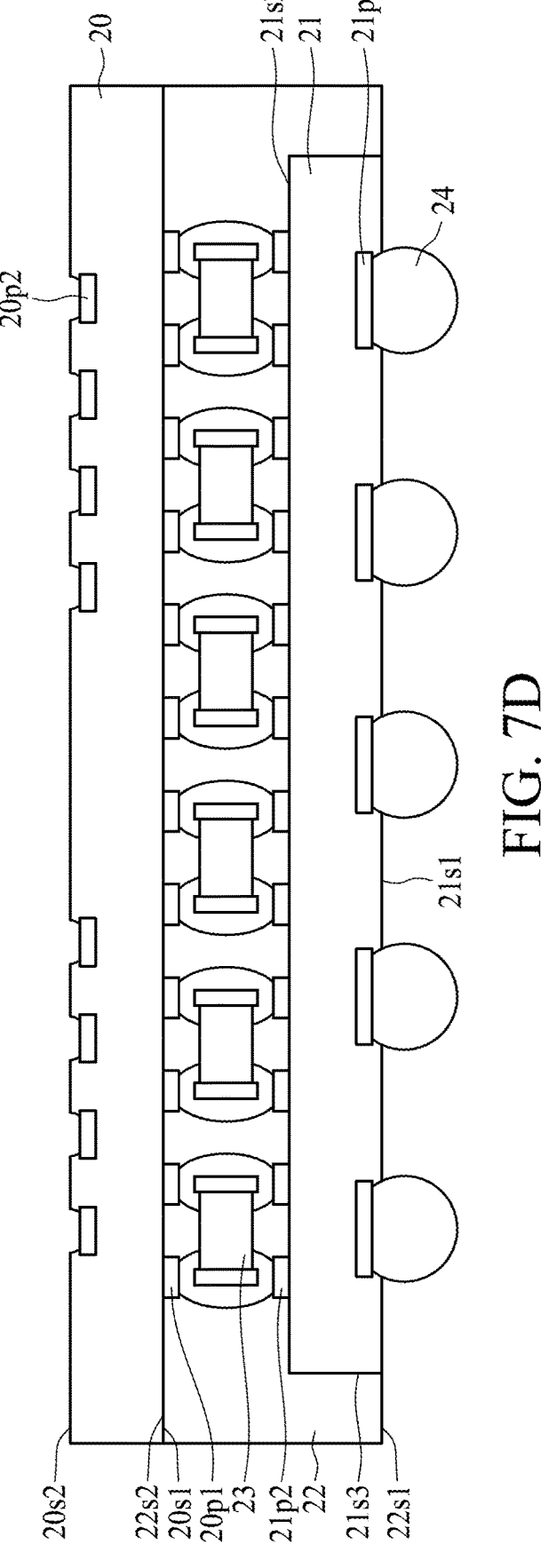

As shown in FIG. 7D, a plurality of connection elements 24 may be formed on the pads 21*p*1 of the carrier 21. Since no encapsulation layer appears on the exposed surfaces of the pads 21*p*1, the connection between the pads 21*p*1 and the connection elements 24 is robust. No additional remedies (e.g., laser etching or polishing) are required for the removal of the encapsulation layer on the area of the exposed surfaces of the pads 21*p*1.

Furthermore, the carrier 20 and the encapsulation layer 22 may be singulated to form a package unit.

Figure 7E:
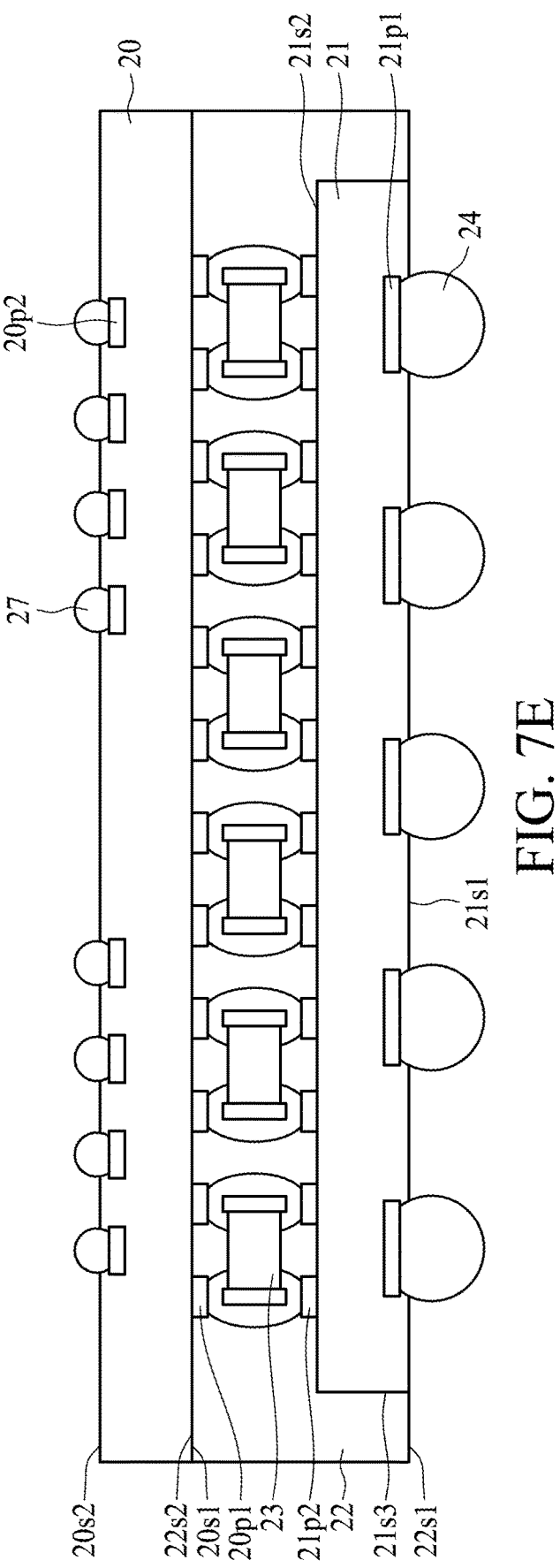

As shown in FIG. 7E, a plurality of connection elements 27 may be formed on the pads 20*p*2 of the carrier 20. After the mounting of the connection elements 27 to the carrier 20, a thermal (reflow) process and/or cleaning (de-flux) process may be applied. Afterwards, one or more electronic components 28 may be mounted to the second surface 20*s*2 of the carrier 20 through the connection elements 27 to form an electronic device 5 in FIG. 5.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to 4°, less than or equal to ±3°, less than or equal to ±2°, less than or equal to ±1, less than or equal to ±0.5°, less than or equal to ±0.1°, or less than or equal to ±0.05°.

Two surfaces can be deemed to be coplanar or substantially coplanar if a displacement between the two surfaces is no greater than 5 µm, no greater than 2 µm, no greater than 1 µm, or no greater than 0.5 µm. A surface can be deemed to be substantially flat if a displacement between a highest point and a lowest point of the surface is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising: a carrier having a predetermined region and comprising a pad disposed in the predetermined region; and a protection layer disposed over the carrier and defining the predetermined region, wherein the protection layer is configured to block an encapsulation layer from covering the pad, wherein in a cross-sectional view, the protection layer comprises a blocking structure disposed at opposite two sides of the pad, the blocking structure defines a recess, the blocking structure is covered by the encapsulation layer and a portion of the blocking structure is exposed by the encapsulation layer.

2. The electronic device of claim 1, wherein the blocking structure is spaced apart from the pad.

3. The electronic device of claim 1, wherein a first elevation of a top surface of the pad is lower than a second elevation of the recess with respect to a surface of the carrier facing away from the protection layer.

4. The electronic device of claim 1, wherein, in the cross-sectional view, a width of the recess is greater than a depth of the recess.

5. The electronic device of claim 1, wherein the carrier comprises a conductive layer defines a trench and the pad, wherein the blocking structure is disposed within and above the trench.

6. The electronic device of claim 1, wherein the blocking structure has a curved surface.

7. An electronic device, comprising: a carrier comprising a plurality of pads; an encapsulation layer covering a periphery region of the carrier, wherein, in a top view, a portion of the encapsulation layer is disposed at a periphery area of at least one pad of the pads; and a protection layer disposed between the carrier and the encapsulation layer, wherein the protection layer has a first recess and a second recess between which the encapsulation layer extends, wherein the encapsulation layer further extends into the first recess and the second recess.

8. The electronic device of claim 7, wherein, in the top view, the portion of the encapsulation layer has an inner contour substantially identical to an outer contour of the at least one pad.

9. The electronic device of claim 8, wherein, in the top view, the inner contour of the portion of the encapsulation layer has a first curvature substantially identical to a second curvature of the outer contour of the at least one pad.

10. The electronic device of claim 7, wherein, in the top view, the encapsulation layer is disposed between the plurality of pads.

11. The electronic device of claim 7, further comprising a blocking structure adjacent to the plurality of pads, wherein a thickness of the encapsulation layer is thicker at one side closer to the blocking structure.

12. The electronic device of claim 7, further comprising a blocking structure adjacent to the plurality of pads, wherein a thickness of the encapsulation layer is taper at one side closer to the blocking structure.

13. An electronic device, comprising:

a protection layer comprising an opening and a blocking structure configured to block an encapsulation layer from entering the opening; and a connection element disposed in the opening and configured to connect an external device other than the electronic device, wherein the protection layer comprises a plurality of recesses, wherein the opening is disposed between the recesses, wherein the plurality of recesses are filled with the encapsulation layer.

14. The electronic device of claim 13, further comprising a conductive pad exposed by the opening and connected to the connection element.

15. The electronic device of claim 14, wherein a portion of the conductive pad is covered by the protection layer.

* * * * *